(12) United States Patent
Yamazaki et al.

(10) Patent No.: US 9,818,978 B2
(45) Date of Patent: Nov. 14, 2017

(54) LIGHT EMITTING DEVICE

(71) Applicant: Semiconductor Energy Laboratory Co., Ltd., Kanagawa-ken (JP)

(72) Inventors: Shunpei Yamazaki, Tokyo (JP); Toru Takayama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/219,637

(22) Filed: Jul. 26, 2016

(65) Prior Publication Data
US 2017/0018736 A1    Jan. 19, 2017

Related U.S. Application Data

(63) Continuation of application No. 14/816,654, filed on Aug. 3, 2015, now Pat. No. 9,406,903, which is a
(Continued)

(30) Foreign Application Priority Data

Oct. 30, 2001   (JP) .................................. 2001-332904
May 17, 2002   (JP) .................................. 2002-143787

(51) Int. Cl.
*H01L 51/50*   (2006.01)
*H01L 27/28*   (2006.01)
(Continued)

(52) U.S. Cl.
CPC ...... *H01L 51/5253* (2013.01); *H01L 27/3244* (2013.01); *H01L 27/3246* (2013.01);
(Continued)

(58) Field of Classification Search
CPC ............. H01L 2924/00; H01L 51/5012; H01L 27/3246; H01L 51/0035; H01L 51/005; H01L 51/0081
(Continued)

(56) References Cited

U.S. PATENT DOCUMENTS 5,550,066 A    8/1996   Tang et al.
5,693,963 A *  12/1997  Fujimoto .............. H01L 33/325
                                                    257/102
(Continued)

FOREIGN PATENT DOCUMENTS

EP    0 717 439 A2    6/1996
EP    1 058 484 A1    12/2000
(Continued)

OTHER PUBLICATIONS

Tsutsui, T. et al., "Electroluminescence in Organic Thin Films," Photochemical Processes in Organized Molecular Systems, 1991, pp. 437-450.
(Continued)

*Primary Examiner* — Jonathan Han
(74) *Attorney, Agent, or Firm* — Husch Blackwell LLP

(57) ABSTRACT

An objective is to increase the reliability of a light emitting device structured by combining TFTs and organic light emitting elements. A TFT (1201) and an organic light emitting element (1202) are formed on the same substrate (1203) as structuring elements of a light emitting device (1200). A first insulating film (1205) which functions as a blocking layer is formed on the substrate (1203) side of the TFT (1201), and a second insulating film (1206) is formed on the opposite upper layer side as a protective film. In addition, a third insulating film (1207) which functions as a barrier film is formed on the lower layer side of the organic light emitting element (1202). The third insulating film (1207) is formed by an inorganic insulating film such as a silicon nitride film, a silicon oxynitride film, an aluminum nitride film, an aluminum oxide film, or an aluminum oxynitride film. A fourth insulating film (1208) and a partitioning layer (1209) formed on the upper layer side of the
(Continued)

organic light emitting element (1202) are formed using similar inorganic insulating films.

20 Claims, 16 Drawing Sheets

Related U.S. Application Data continuation of application No. 14/341,172, filed on Jul. 25, 2014, now Pat. No. 9,099,678, which is a continuation of application No. 11/953,356, filed on Dec. 10, 2007, now Pat. No. 8,790,938, which is a continuation of application No. 11/045,873, filed on Jan. 28, 2005, now Pat. No. 7,307,279, which is a continuation of application No. 10/279,635, filed on Oct. 24, 2002, now Pat. No. 6,852,997.

(51) Int. Cl.
    *H01L 51/52*     (2006.01)
    *H01L 27/32*     (2006.01)
    *H01L 51/00*     (2006.01)
    *H01L 51/56*     (2006.01)

(52) U.S. Cl.
CPC ...... *H01L 27/3248* (2013.01); *H01L 27/3258* (2013.01); *H01L 51/0034* (2013.01); *H01L 51/0035* (2013.01); *H01L 51/0036* (2013.01); *H01L 51/0097* (2013.01); *H01L 51/5016* (2013.01); *H01L 51/5056* (2013.01); *H01L 51/5088* (2013.01); *H01L 51/5246* (2013.01); *H01L 51/5259* (2013.01); *H01L 51/56* (2013.01); *H01L 51/006* (2013.01); *H01L 51/0058* (2013.01); *H01L 51/0059* (2013.01); *H01L 51/0072* (2013.01); *H01L 51/0078* (2013.01); *H01L 51/0081* (2013.01); *H01L 51/0085* (2013.01); *H01L 51/5237* (2013.01); *H01L 2227/323* (2013.01); *H01L 2251/301* (2013.01); *H01L 2251/303* (2013.01); *H01L 2251/5338* (2013.01); *H01L 2251/558* (2013.01)

(58) Field of Classification Search
USPC .............. 257/40, 90, E27.11, 102; 438/29
See application file for complete search history.

(56) References Cited

U.S. PATENT DOCUMENTS

| | | | |
|---|---|---|---|
| 5,815,226 A | 9/1998 | Yamazaki et al. | |
| 5,952,708 A | 9/1999 | Yamazaki | |
| 5,990,542 A | 11/1999 | Yamazaki | |
| 6,169,293 B1 | 1/2001 | Yamazaki | |
| 6,175,345 B1 | 1/2001 | Kuribayashi et al. | |
| 6,239,470 B1 | 5/2001 | Yamazaki | |
| 6,259,838 B1 | 7/2001 | Singh et al. | |
| 6,420,200 B1 | 7/2002 | Yamazaki et al. | |
| 6,441,468 B1 | 8/2002 | Yamazaki | |
| 6,445,059 B1 | 9/2002 | Yamazaki | |
| 6,501,217 B2 | 12/2002 | Beierlein et al. | |
| 6,541,294 B1 | 4/2003 | Yamazaki et al. | |
| 6,587,086 B1 | 7/2003 | Koyama | |
| 6,605,826 B2 | 8/2003 | Yamazaki et al. | |
| 6,646,284 B2 | 11/2003 | Yamazaki et al. | |
| 6,646,287 B1 | 11/2003 | Ono et al. | |
| 6,664,732 B2 | 12/2003 | Yamazaki et al. | |
| 6,689,492 B1 | 2/2004 | Yamazaki et al. | |
| 6,828,727 B2 | 12/2004 | Yamazaki | |
| 6,897,608 B2 | 5/2005 | Yamazaki et al. | |
| 6,958,251 B2 | 10/2005 | Yamazaki et al. | |
| 7,008,828 B2 | 3/2006 | Ono et al. | |
| 7,034,456 B2 | 4/2006 | Yamazaki et al. | |
| 7,112,115 B1 | 9/2006 | Yamazaki et al. | |
| 7,147,530 B2 | 12/2006 | Yamazaki et al. | |
| 7,232,742 B1 | 6/2007 | Maekawa | |
| 7,239,083 B2 | 7/2007 | Koyama | |
| 7,342,251 B2 | 3/2008 | Yamazaki et al. | |
| 7,560,734 B2 | 7/2009 | Ono et al. | |
| 7,633,223 B2 | 12/2009 | Yamazaki | |
| 7,923,269 B2 | 4/2011 | Yamazaki et al. | |
| 8,120,039 B2 | 2/2012 | Ono et al. | |
| 8,202,743 B2 | 6/2012 | Yamazaki et al. | |
| 2001/0005021 A1* | 6/2001 | Fukuyama ............ C09K 11/06 257/103 | |
| 2001/0019133 A1* | 9/2001 | Konuma ................ H01L 27/12 257/79 | |
| 2001/0020922 A1* | 9/2001 | Yamazaki ................ G09G 3/30 345/45 | |
| 2001/0024083 A1* | 9/2001 | Yamazaki ........... H01L 27/3281 313/483 | |
| 2001/0026846 A1* | 10/2001 | Yamazaki ........... H01L 51/5012 427/535 | |
| 2001/0053559 A1 | 12/2001 | Nagao et al. | |
| 2007/0018566 A1 | 1/2007 | Yamazaki et al. | |
| 2007/0063646 A1 | 3/2007 | Yamazaki et al. | |

FOREIGN PATENT DOCUMENTS

| | | |
|---|---|---|
| EP | 1 065 725 A2 | 1/2001 |
| EP | 1 615 275 A2 | 1/2006 |
| JP | 05-044017 A | 2/1993 |
| JP | 08-241047 A | 9/1996 |
| JP | 08-288069 A | 11/1996 |
| JP | 10-289784 A | 10/1998 |
| JP | 2000-077191 A | 3/2000 |
| JP | 2001-052873 A | 2/2001 |
| JP | 2001-076873 A | 3/2001 |
| JP | 2001-507167 | 5/2001 |
| JP | 2001-203076 A | 7/2001 |
| WO | WO 99/39393 A1 | 8/1999 |

OTHER PUBLICATIONS

Baldo, M.A. et al., "Highly Efficient Phosphorescent Emission From Organic Electroluminescent Devices," Nature, Sep. 10, 1998, vol. 395, pp. 151-154.

Baldo, M.A. et al., "Very High-Efficiency Green Organic Light-Emitting Devices Based on Electrophosphorescence," Applied Physics Letters, Jul. 5, 1999, vol. 75, No. 1, pp. 4-6.

Tsutsui, T. et al., "High Quantum Efficiency in Organic Light-Emitting Devices With Iridium-Complex as a Triplet Emissive Center," Japanese Journal of Applied Physics, Dec. 15, 1999, vol. 38, No. 12B, pp. L1502-L1504.

* cited by examiner

CONDITION OF SPUTTERING IS SHOWN IN TABLE 1.

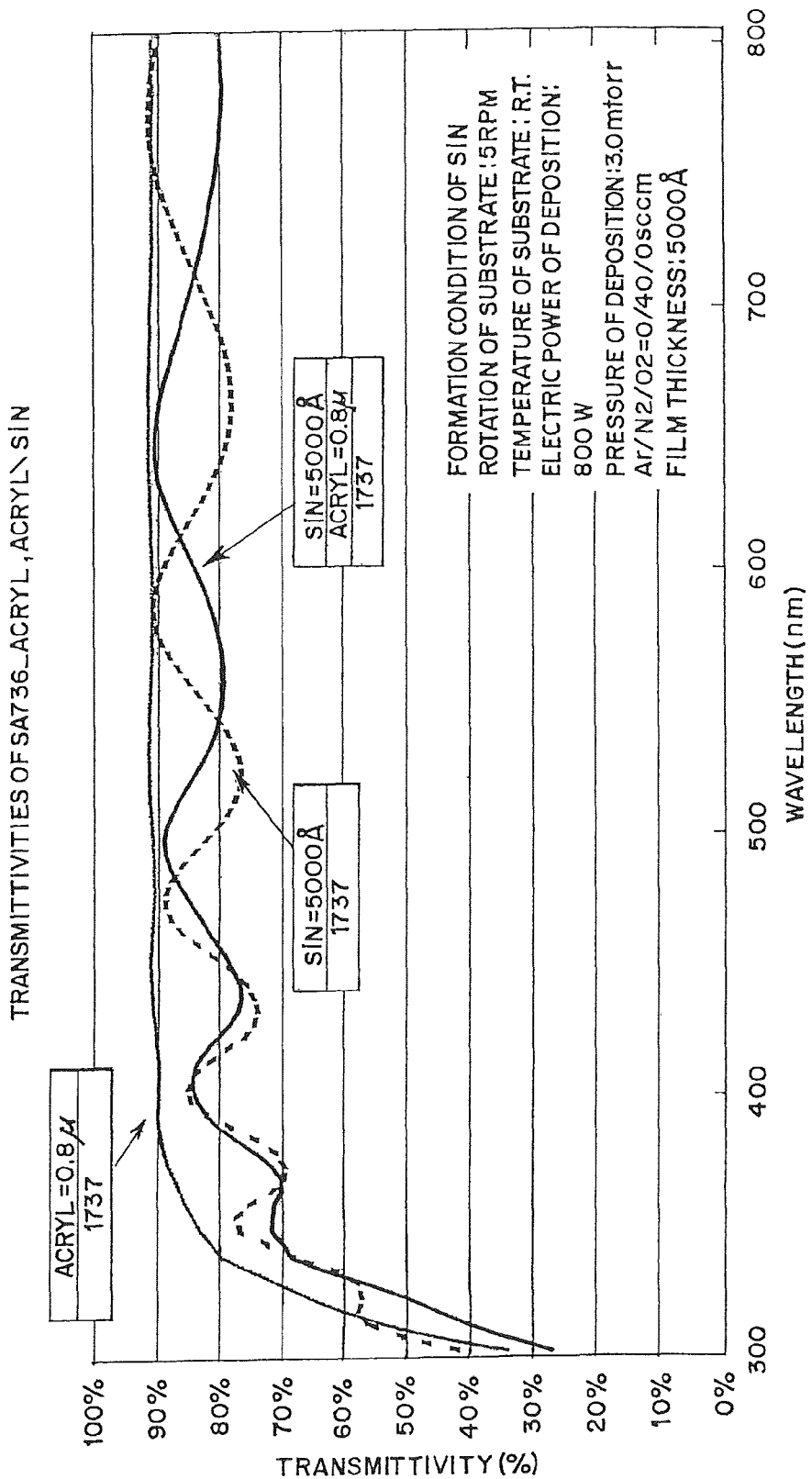

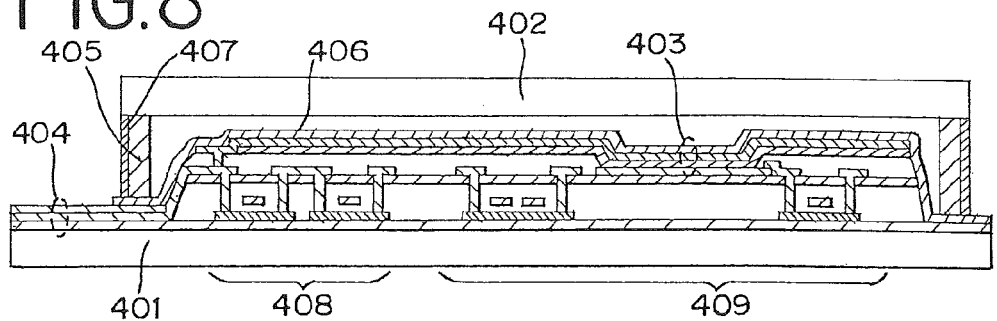
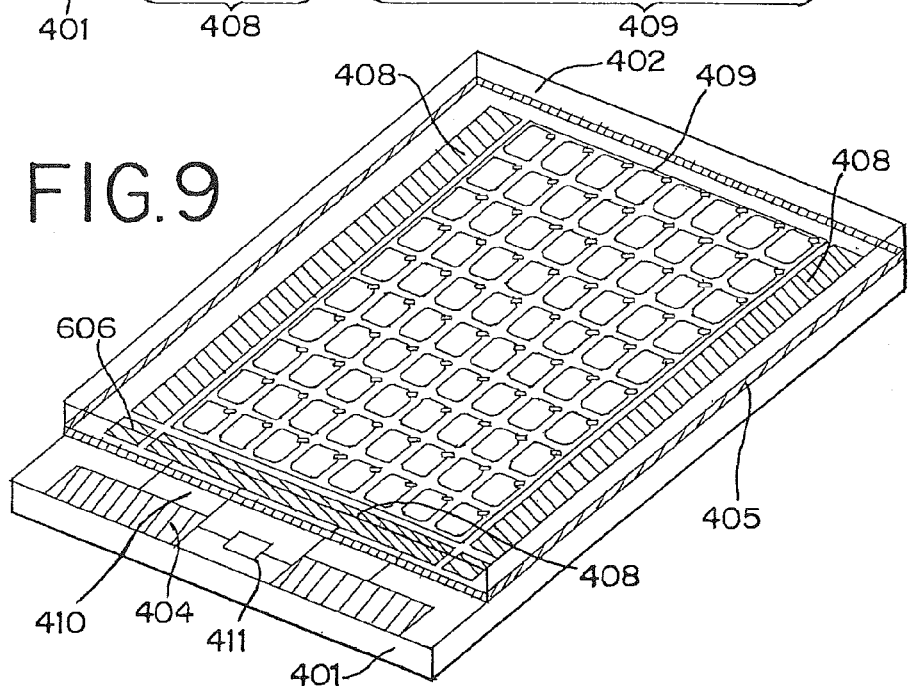
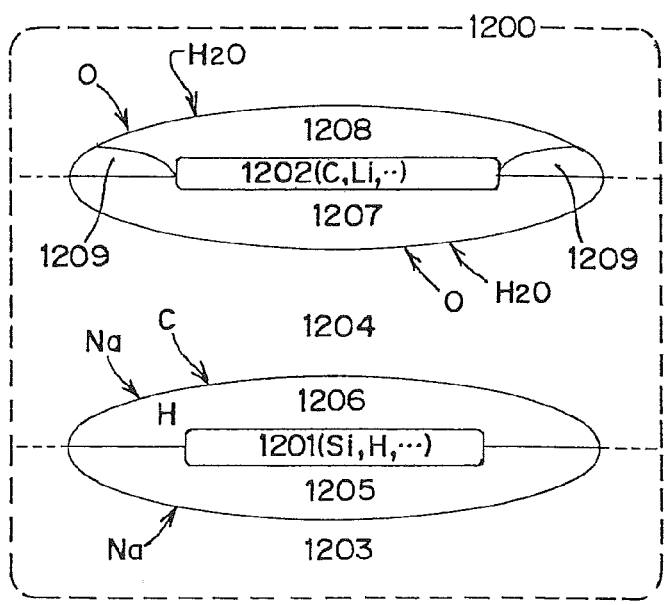

FILM FORMATION CONDITIONS ARE SHOWN IN TABLES 1 AND 2, RESPECTIVELY

C-V CHARACTERISTICS OF MOS STRUCTURE IN CASE OF PRESENCE OF Li DIFFUSION SOURCE
Al-Si(400nm)\ Si WEFER\ PCVD-SiN(100nm)\ Al-Li(400nm)

BT STRESS TEST CONDITION:
150°C, 1.7 MV/cm
1HR

C-V CHARACTERISTICS OF MOS STRUCTURE WITHOUT Li DIFFUSION SOURCE

C-V CHARACTERISTICS OF MOS STRUCTURE WITH Li DIFFUSION SOURCE

MOS STRUCTURE USING PCVD-SiN FILM

MOS STRUCTURE USING RFSP-SiN FILM

CuPc

Alq$_3$

CBP

Ir(p) [structure] Ir$_3$

FIG. 19

$$^3M* + {}^3O_2 \rightarrow M + {}^1O_2$$

FIG. 20

FORMATION CONDITION OF RFSP-SiN

|  | PROCESS CONDITION | TYPICAL EXAMPLE | NOTE |
|---|---|---|---|
| GAS | N$_2$ OR RARE GAS/N$_2$ | Ar/N$_2$ | PURITY 4N OR MORE |
| GAS FLOW RATIO | N2:30~100%,RARE GAS:0~70% | Ar:N$_2$ = 20:20(sccm) | RARE GAS MAY BE INTRODUCED FROM REAR SURFACE OF SUBSTRATE AS A HEATING GAS. |
| PRESSURE(Pa) | 0.1~1.5 | 0.8 |  |
| FREQUENCY(MHZ) | 13~40 | 13.56 |  |
| ELECTRIC POWER (W/cm$^2$) | 5~20 | 16.5 |  |
| TEMPERATURE OF SUBSTRATE(°C) | RT(ROOM TEMPERATURE)~350 | 200 |  |
| MATERIAL OF TARGET | MATERIAL QUARRIED FROM INGOT OF SINGLE CRYSTAL SILICON | Si(1~10Ωcm) |  |
| T/S(mm) | 40~200 | 60 |  |
| BACKGROUND PRESSURE(Pa) | 1×10$^{-3}$ OR LESS (PREFERABLY 3×10-5 OR LESS) | 3×10$^{-5}$ | USING TURBO MOLECULAR PUMP OR CRYO PUMP |

FIG. 21

CONDITION OF PLASMA CVD

|  | PCVD-SiN |
|---|---|
| GAS | SiH$_4$/NH$_3$/N$_2$/H$_2$ |
| GAS FLOW (sccm) | SiH4:NH3:N2:H2 = 30:240:300:60 |
| PRESSURE(Pa) | 159 |
| FREQUENCY(MHZ) | 13.56 |
| ELECTRIC POWER (W/cm$^2$) | 0.35 |
| TEMPERATURE OF SUBSTRATE(°C) | 325 |

FIG. 22

COMPARISON OF TYPICAL PARAMETERS OF SiN

| PARAMETER | SiN FORMED BY FILM FORMATION CONDITION OF TABLE 1 | | SiN FORMED BY FILM FORMATION CONDITION OF TABLE 2 | NOTE |
|---|---|---|---|---|
| | RFSP-SiN (NO.1) | RFSP-SiN (NO.2) | PCVD-SiN FILM | |
| DIELECTRIC CONSTANT | 7.02~9.30 | ← | ~7 | |
| REFRACTIVE INDEX | 1.91~2.13 | ← | 2.0~2.1 | WAVELENGTH: 632.8nm |
| INTERNAL STRESS (dyn/cm$^2$) | 4.17×10$^8$ | ← | 9.11×10$^8$ | |
| ETCHING SPEED (nm/min) | 0.77~1.31 | 1~8.6 | ~30 | LAL500, 20°C |
| CONCENTRATION OF Si (ATOMIC %) | 37.3 | 51.5 | 35.0 | RBS |
| CONCENTRATION OF N (ATOMIC %) | 55.9 | 48.5 | 45.0 | RBS |
| CONCENTRATION OF H (ATOMS/cc) | 4×10$^{20}$ | — | 1×10$^{22}$ | SIMS |
| CONCENTRATION OF O (ATOMS/cc) | 8×10$^{20}$ | — | 3×10$^{18}$ | SIMS |
| CONCENTRATION OF C (ATOMS/cc) | 1×10$^{19}$ | — | 4×10$^{17}$ | SIMS |

FIG. 23

PARAMETER OF SiN USING IN THE PRESENT INVENTION

| PARAMETER | SiN FILM USING IN THE PRESENT INVENTION | NOTE |
|---|---|---|
| DIELECTRIC CONSTANT | 7.0~9.5 (PREFERABLY 7.3~7.7) | |
| REFRACTIVE INDEX | 1.85~2.20 (PREFERABLY 1.90~2.15) | WAVELENGTH: 632.8nm |
| INTERNAL STRESS (dyn/cm$^2$) | 2×10$^{10}$ OR LESS (PREFERABLY 5×10$^8$ OR LESS) | |
| ETCHING SPEED (nm/min) | 9 OR LESS (PREFERABLY 0.5~3.5) | LAL500, 20°C |
| CONCENTRATION OF Si (ATOMIC %) | 35~55 (PREFERABLY 37~52) | RBS |
| CONCENTRATION OF N (ATOMIC %) | 45~60 (PREFERABLY 48~56) | RBS |
| CONCENTRATION OF H (ATOMS/cc) | 1×10$^{21}$ OR LESS (PREFERABLY 5×10$^{20}$ OR LESS) | SIMS |
| CONCENTRATION OF O (ATOMS/cc) | 5×10$^{18}$~5×10$^{21}$ (PREFERABLY 1×10$^{19}$~1×10$^{21}$) | SIMS |
| CONCENTRATION OF C (ATOMS/cc) | 1×10$^{18}$~5×10$^{19}$ (PREFERABLY 1×10$^{18}$~2×10$^{19}$) | SIMS |

LIGHT EMITTING DEVICE

This application is a continuation of copending U.S. application Ser. No. 14/816,654, filed on Aug. 3, 2015 which is a continuation of U.S. application Ser. No. 14/341,172, filed on Jul. 25, 2014 (now U.S. Pat. No. 9,099,678 issued Aug. 4, 2015) which is a continuation of U.S. application Ser. No. 11/953,356, filed on Dec. 10, 2007 (U.S. Pat. No. 8,790,938 issued Jul. 29, 2014) which is a continuation of U.S. application Ser. No. 11/045,873, filed on Jan. 28, 2005 (now U.S. Pat. No. 7,307,279 issued Dec. 11, 2007) which is a continuation of U.S. application Ser. No. 10/279,635, filed on Oct. 24, 2002 (now U.S. Pat. No. 6,852,997 issued Feb. 8, 2005), which are all incorporated herein by reference.

BACKGROUND OF THE INVENTION

1. Field of the Invention

The present invention relates to a light emitting device prepared with a light emitting element capable of obtaining fluorescence or phosphorescence. In particular, the present invention relates to a light emitting device in which an active element such as an insulated gate transistor or a thin film transistor, and a light emitting element connected to the active element, are formed in each pixel.

2. Description of the Related Art

Display devices using liquid crystals are structures that typically employ a back light or a front light, and display an image by using light from the back light or the front light. Liquid crystal display devices are employed as image displaying means in various types of electronic devices, but have a structural disadvantage in that they possess a small angle of view. In contrast, the angle of view is wide for display devices that use a light emitter capable of obtaining electroluminescence as displaying means, and there is superior visibility. Such devices are therefore looked upon as next generation display devices.

The structure of a light emitting element which uses an organic compound as a light emitter (hereafter referred to as organic light emitting element) is one in which hole injecting layers, hole transporting layers, light emitting layers, electron transporting layers, electron injecting layers, and the like formed by organic compounds are suitably combined between a cathode and an electrode. Hole injecting layers and hole transporting layers are differentiated and denoted separately here, but they are the same in that their hole transporting characteristics (hole mobility) are very important in particular. For convenience in making the distinction, the hole injecting layer is the layer contacting the anode, and the layer contacting the light emitting layer is referred to as the hole transporting layer. Further, the layer contacting the cathode is referred to as the electron injecting layer, and the layer contacting the other side of the light emitting layer is referred to as the electron transporting layer. The light emitting layer may also serve as the electron transporting layer, and is referred to as a light emitting electron transporting layer in that case.

A mechanism in which light is emitted by electroluminescence can be considered as a phenomenon in which electrons injected from a cathode and holes injected from an anode recombine in a layer made from a light emitter (light emitting layer), forming excitons. Light is emitted when the excitons return to a base state. Fluorescence and phosphorescence exist as types of electroluminescence, and these can be understood as light emission from singlet state excitation (fluorescence) and light emission from triplet state excitation (phosphorescence). The brightness of the emitted light extends from several thousands to several tens of thousands of $cd/m^2$, and therefore it can be considered possible in principle to apply this light emission to display devices and the like. However, problems remain in that degradation phenomena exist, and this impedes utilization of electroluminescence.

Low molecular weight organic compounds and high molecular weight organic compounds are known as organic compounds for forming organic light emitting elements. Examples of low molecular weight organic compounds include: α-NPD (4,4'-bis-[N-(naphthyl)-N-phenyl-amino] biphenyl) and MTDATA (4,4',4''-tris-(N-3-methylphenyl-N-phenyl-amino) triphenyl amine), both copper phthalocyanine (CuPc) aromatic amine-based materials, used as hole injecting layers; and a tris-8-quinolinolate aluminum complex ($Alq_3$) and the like used as light emitting layers. Among high molecular weight organic light emitting materials, polyaniline, polythiophene derivatives (PEDOT), and the like are known.

From the standpoint of material diversity, low molecular weight organic compounds manufactured by evaporation have striking diversity compared with high molecular weight organic materials. However, whichever type is used, organic compounds made purely from only basic structural units are rare, and there are also times when dissimilar bonds and impurities are mixed in during manufacturing processes, and times when various additives such as pigments are added. Further, there are materials which deteriorate due to moisture, materials which easily oxidize, and the like among these materials. Moisture, oxygen, and the like can easily mix in from the atmosphere, and therefore it is necessary to exert care in handling.

JP 8-241047 A may be referred to for an example of a combination of a thin film transistor (TFT) and a light emitting element. This publication discloses a structure in which an organic electroluminescence layer is formed, through an insulating film made from silicon dioxide, on a TFT that uses polycrystalline silicon. Further, a passivation layer, having an end portion which is processed into a tapered shape on an anode, is positioned in a lower layer side of the organic electroluminescence layer. A material having a work function equal to or lower than 4 eV is selected for a cathode. A material in which a metal such as silver or aluminum is alloyed with magnesium is applied.

Impurities form localized levels within a forbidden band caused by oxygen in semiconductor elements having semiconductor junctions such as diodes, and the localized levels become a factor in junction leakage and reducing the carrier lifetime, and are known to greatly lower the characteristics of the semiconductor elements.

Six types of factors can be considered for organic light emitting element degradation: (1) chemical change of organic compounds; (2) organic compound melting due to heat generated during driving; (3) dielectric breakdown originating in macro defects; (4) electrode degradation or electrode and organic compound layer interface degradation; (5) degradation caused by instabilities in organic compound amorphous structure; and (6) irreversible damage due to stress or distortion caused by the element structure.

The factor (1) above has its origin in chemical change when passing through an activation state, chemical change due to certain gasses, or water vapor, which are corrosive to organic compounds, or the like. The factors (2) and (3) result from degradation caused by driving the organic light emitting elements. Heat generation is inevitable due to electric current within the elements being converted to Joule heat.

Melting occurs if the melting point, or the glass transition temperature, of the organic compound is low, and electric fields concentrate in portions where pinholes or cracks exist, causing dielectric breakdown. Degradation advances even at the room temperature due to the factors (4) and (5). The factor (4) is known as dark spots, and originates in cathode oxidation and reactions with moisture. Regarding the factor (5), all organic compounds used in the organic light emitting elements are amorphous materials, and crystallize due to heat emission when stored over a long period of time or are aged, and it can be thought that almost none are capable of stably preserving their amorphous structure. Further, irregularities such as film cracking and fracture due to distortion generated by a difference in the thermal expansion coefficient of structural materials leads to the factor (6). In addition, progressive irregularities such as dark spots also are generated in those portions.

Dark spots are suppressed considerably by raising the level of a sealing technique used, but actual degradation is generated by a combination of the aforementioned factors, and it is difficult to prevent. A method of sealing organic light emitting elements formed on a substrate by using a sealing material, and forming a drying agent such as barium oxide in the sealed space has been devised as a typical sealing technique.

It is known that organic compounds form double bonds due to photo-deterioration, changing into structures containing oxygen (such as —OH, —OOH, >C═O, —COOH). It can therefore be thought that the bonding state changes, and degradation proceeds, for cases in which the organic compounds are placed within an atmosphere containing oxygen, or for cases in which oxygen and moisture are contained within the organic compounds as impurities.

FIG. 17 is a graph showing the distribution in the depth direction of oxygen (O), nitrogen (N), hydrogen (H), silicon (Si), and copper (Cu) in an organic light emitting element as measured by secondary ion mass spectroscopy (SIMS). The structure of a sample used in the measurement is as follows: a tris-8-quinolinolate aluminum complex ($Alq_3$)/a carbazole-based material ($Ir(ppy)_3$+CBP)/copper phthalocyanine (CuPc)/a conductive oxide material (ITO)/a glass substrate. As shown by the chemical formula in FIG. 18B, $Alq_3$ contains oxygen within its molecules.

On the other hand, the structures shown in the chemical formulae in FIG. 18C and FIG. 18A for ($Ir(ppy)_3$+CBP) and CuPc do not contain oxygen within their molecules.

The highest occupied molecular orbital (HOMO) degenerates, and therefore oxygen molecules are triplet state specific molecules at a base state. An excitation process from a triplet to a singlet normally becomes a forbidden transition (spin forbidden), and thus difficult to occur. Singlet state oxygen molecules therefore do not develop. However, if triplet state excitation state molecules ($^3M^*$) having a higher energy state than that for singlet excitation exist in the periphery of the oxygen molecules, then an energy transfer like that shown below occurs, and this can lead to a reaction in which singlet state oxygen molecules develop.

It is said that 75% of the molecular excitation states in the light emitting layer of an organic light emitting element are triplet states. Singlet state oxygen molecules can therefore be generated by the energy transfer of FIG. 19 for cases in which oxygen molecules are mixed inside the organic light emitting element. Singlet excitation state oxygen molecules have ionic qualities (electric charge polarization), and therefore the possibility of a reaction with charge polarization that develops in the organic compound can be considered.

For example, methyl groups in vasocuproin (hereinafter, referred to as BCP) are electron donators, and therefore carbon bonded directly to conjugate rings is charged positively. Singlet oxygen having ionic qualities reacts as shown in FIG. 18D if there is positively charged oxygen, and there is a possibility that carboxylic acid and water are formed as shown in FIG. 18E. As a result, it is expected that the electron transporting characteristics become deteriorated.

On the other hand, TFTs using a semiconductor as an active layer are damaged by alkaline metals and alkaline earth metals, which are used as cathode materials in organic light emitting elements. That is, mobile ions in these materials get mixed into a gate insulating film or within an active layer, and switching operations thus become impossible. In semiconductor manufacturing processes, it is necessary to reduce the concentration of these metallic impurities to be equal to or less than $10^9$ atoms/cm$^2$.

SUMMARY OF THE INVENTION

The present invention has been made in view of the aforementioned problems, and an object of the present invention is to increase the reliability of a light emitting device structured by a combination of TFTs and organic light emitting elements.

In order to prevent light emitting device deterioration, the present invention provides a structure in which: impurities containing oxygen, such as oxygen and moisture, contained within organic compounds forming organic light emitting elements are reduced; the incursion of moisture and oxygen from the outside is prevented; and a structural material, in which these impurities surround an organic compound layer, becomes a diffusion source, and contamination does not occur. Of course this is made into a structure in which moisture and oxygen from the outside do not penetrate. Oxygen, moisture, and the like are contained as organic compound structural elements, and the term "impurity" with respect to organic compounds as used by the present invention denotes exogenous impurities not contained in the original molecular structure. These impurities are assumed to exist within the organic compounds in an atomic state, a molecular state, as free radicals, and as oligomers.

In addition, the present invention is characterized by having a structure for preventing alkaline metals and alkaline earth metals, such as sodium, lithium, and magnesium, from contaminating a TFT of an active matrix drive light emitting device, causing the threshold value voltage to fluctuate, and the like.

The present invention removes impurities, reducing the impurity concentration contained in layers made from organic compounds used in forming an organic light emitting element, such as hole injecting layers, hole transporting layers, light emitting layers, electron transporting layers, and electron injecting layers, to an average concentration equal to or less than $5 \times 10^{19}$/cm$^2$, preferably equal to or less than $1 \times 10^{19}$/cm$^2$. In particular, it is necessary to reduce the oxygen concentration in the light emitting layer and in the vicinity of the light emitting layer. If a phthalocyanine-based or aromatic-based amine hole injecting layer or hole transporting layer is used, then a carbazole-based light emitting layer or the like will be included in the organic compound layer.

If the organic light emitting element luminesces at a brightness of 1000 Cd/cm$^2$, when converted to photons this will correspond to an emission amount of $10^{16}$/sec·cm$^2$. If the quantum efficiency of the light emitting layer is then assumed to be 1%, then the necessary electric current density demanded is 100 mA/cm². In order to obtain good characteristics for an element in which this level of electric current flows, it is necessary that the defect level density be equal to or less than $10^{16}/cm^3$ in accordance with an empirical rule based on a semiconductor element such as a photovoltaic cell or a photodiode using an amorphous semiconductor. In order to achieve this value, it is necessary that the concentration of damaging impurity elements which form defect levels be equal to or less than $5\times10^{19}/cm^2$, preferably equal to or less than $1\times10^{19}/cm^2$, as stated above.

With an active matrix driving method in which a pixel portion is formed by organic light emitting elements, and each pixel of the pixel portion is controlled by an active element, the structure is such that TFTs having a semiconductor film, a gate insulating film, and a gate electrode are formed on a substrate, and the organic light emitting elements are formed on the upper layer of the TFTs. Glass substrates are typical examples of the substrates used, and very small amounts of alkaline metals are contained in barium borosilicate glass and aluminosilicate glass. The semiconductor film is covered by silicon nitride and silicon oxynitride in order to prevent contamination by alkaline metals from the glass substrate on the lower layer side and the organic light emitting element on the upper layer side.

On the other hand, it is preferable that the organic light emitting elements are formed on a leveled surface, and therefore they are formed on a leveling film made from an organic resin material such as polyimide or acrylic. However, these types of organic resin materials are hygroscopic. The organic light emitting elements degrade due to oxygen and moisture, and therefore are covered by an inorganic insulating film selected from the group of gas barrier materials consisting of silicon nitride, silicon oxynitride, diamond like carbon (DLC), carbon nitride (CN), aluminum nitride, aluminum oxide, and aluminum oxynitride. These inorganic insulating films are also effective in preventing the diffusion of alkaline metals or alkaline earth metals, applied as cathode materials, to the TFT side. Further, a partitioning layer formed in the pixel portion is formed by using the same material.

FIG. 10 is a diagram for explaining the concept of an active matrix drive light emitting device of the present invention. A TFT 1201 and an organic light emitting element 1202 are formed on the same substrate 1203 as structuring elements of a light emitting device 1200. The structuring elements of the TFT 1201 are a semiconductor film, a gate insulating film, a gate electrode, and the like. Silicon, hydrogen, oxygen, and nitrogen are contained within the structuring elements, and metals and the like are used in forming the gate electrode. On the other hand, alkaline metals such as lithium and alkaline earth metals are contained in the organic light emitting element 1202 in addition to the main organic compound material structuring element carbon.

A first insulating film 1205 is formed on the lower layer side of the TFT 1201 (the substrate 1203 side) as a blocking layer. A hydrogen containing silicon nitride film, a hydrogen containing silicon oxynitride film, or the like is applied as the first insulating film 1205. A second insulating film 1206 is formed on the opposite upper layer side as a protective film. A hydrogen containing silicon nitride film, a hydrogen containing silicon oxynitride film, or the like is also applied as the second insulating film 1206.

A third insulating film 1207 is formed as a barrier film on the lower layer side of the organic light emitting element 1202. An inorganic insulating film such as a silicon nitride film, a silicon oxynitride film, aluminum nitride, aluminum oxide, or aluminum oxynitride is formed as the third insulating film 1207. It is preferable to reduce the concentration of hydrogen contained within the film to be equal to or less than 1 atomic % in order to form these films densely. A fourth insulating film 1208 and a partitioning layer 1209 formed on the upper layer side of the organic light emitting element 1202 are formed using similar organic insulating films.

An organic resin interlayer insulating film 1204 is formed between the second insulating film 1206 and the third insulating film 1207, unifying the three films. Alkaline metals, the most disliked by the TFT 1201, are shielded by the first insulating film 1205 and the second insulating film 1206. Further, these films become sources for supplying hydrogen which compensates defects in the semiconductor film that is a TFT structural material. On the other hand, the organic light emitting element 1202 most dislikes oxygen and moisture, and the third insulating film 1207, the fourth insulating film 1208, and the partitioning layer 1209 are formed with the objective of shielding the organic light emitting element 1202 from oxygen and moisture. Furthermore, these films also function to prevent alkaline metals and alkaline earth metals in the organic light emitting element 1202 from diffusing to the outside.

According to a structure of the present invention, a light emitting device comprises: a first insulating film and a second insulating film formed by silicon nitride or silicon oxynitride; a semiconductor layer, a gate insulating film, and a gate electrode formed between the first insulating film and the second insulating film; a third insulating film and a fourth insulating film formed by an inorganic insulating material made from a nitride; a partitioning layer formed by an inorganic insulating material made from a nitride; an organic compound layer formed surrounded by the third insulating film, the fourth insulating film, and the partitioning layer; and a cathode formed contacting the organic compound layer.

Further, according to another structure of the present invention, a light emitting device comprises: a first insulating film and a second insulating film formed by silicon nitride or silicon oxynitride; a semiconductor layer of a thin film transistor, a gate insulating film, and a gate electrode formed between the first insulating film and the second insulating film; a third insulating film and a fourth insulating film formed by an inorganic insulating material made from a nitride; a partitioning layer formed by an inorganic insulating material made from a nitride; an organic compound layer of an organic light emitting element formed surrounded by the third insulating film, the fourth insulating film, and the partitioning layer; and a cathode formed contacting the organic compound layer.

The first insulating film to the fourth insulating film, and the partitioning layer in the above structure are not in particular limited in their manufacturing method. However, a particularly preferable embodiment is to form the first insulating film and the second insulating film by using a chemical vapor phase growth method such as plasma CVD, and to for the third insulating film, the fourth insulating film, and the partitioning layer using dense films having good adhesion properties by using a physical film formation method such as sputtering. In particular, inorganic insulating films formed by high frequency sputtering are suitable. Specifically, silicon nitride manufactured by high frequency sputtering using a silicon as a target is suitable. It is preferable that the amount of oxygen and hydrogen contained be reduced to be equal to or less than 10 atomic %, more preferably equal to or less than 1 atomic %, in order to increase the blocking characteristics at this point. Further, aluminum nitride and aluminum oxynitride can also be applied as other materials.

An organic resin interlayer insulating film is formed between the second insulating film and the third insulating film in the above structure of the present invention, and the interlayer insulating film applies a structure that is used as a leveling film.

In order to give a light emitting device thus structured by combining TFTs and organic light emitting elements repulsive qualities with respect to impurity contaminants, the light emitting device is formed by ingeniously combining insulating films having blocking characteristics with respect to oxygen and moisture, thus preventing deterioration due to the mutual contamination of impurities.

Note that the term light emitting device as used in this specification indicates general devices using the aforementioned light emitters. Further, modules in which a TAB (tape automated bonding) tape or a TCP (tape carrier package) is attached to an element having a layer containing a light emitter between an anode and a cathode (hereafter referred to as a light emitting element), modules in which a printed circuit board is formed at the end of a TAB tape or a TCP, and modules in which an IC is mounted by a COG (chip on glass) method to a substrate on which a light emitting element is formed are all included in the category of light emitting devices. Furthermore, the concentration of oxygen as an impurity element as used in this specification indicates the lowest concentration as measured by secondary ion mass spectroscopy (SIMS).

BRIEF DESCRIPTION OF THE DRAWINGS

In the accompanying drawings:

FIG. 4 is a transmittivity spectrum of a silicon nitride film formed by high frequency sputtering using silicon as a target and only nitrogen gas;

FIG. 8 is a cross sectional diagram for explaining the structure of a light emitting device;

FIG. 9 is a perspective diagram for explaining an outer appearance of a light emitting device;

FIG. 10 is a diagram for explaining the concept of a light emitting device of the present invention;

FIG. 19 is an equation that shows the generation of single state oxygen molecules by triplet state excitation molecules;

FIG. 20 is a table for formation condition of RFSP-SiN;

FIG. 21 is a table for condition of plasma CVD;

FIG. 22 is a table for comparison of typical parameters of SiN; and

FIG. 23 is a table for parameter of SiN using the present invention.

DETAILED DESCRIPTION OF THE PREFERRED EMBODIMENTS

Embodiment Mode

Figure 1:
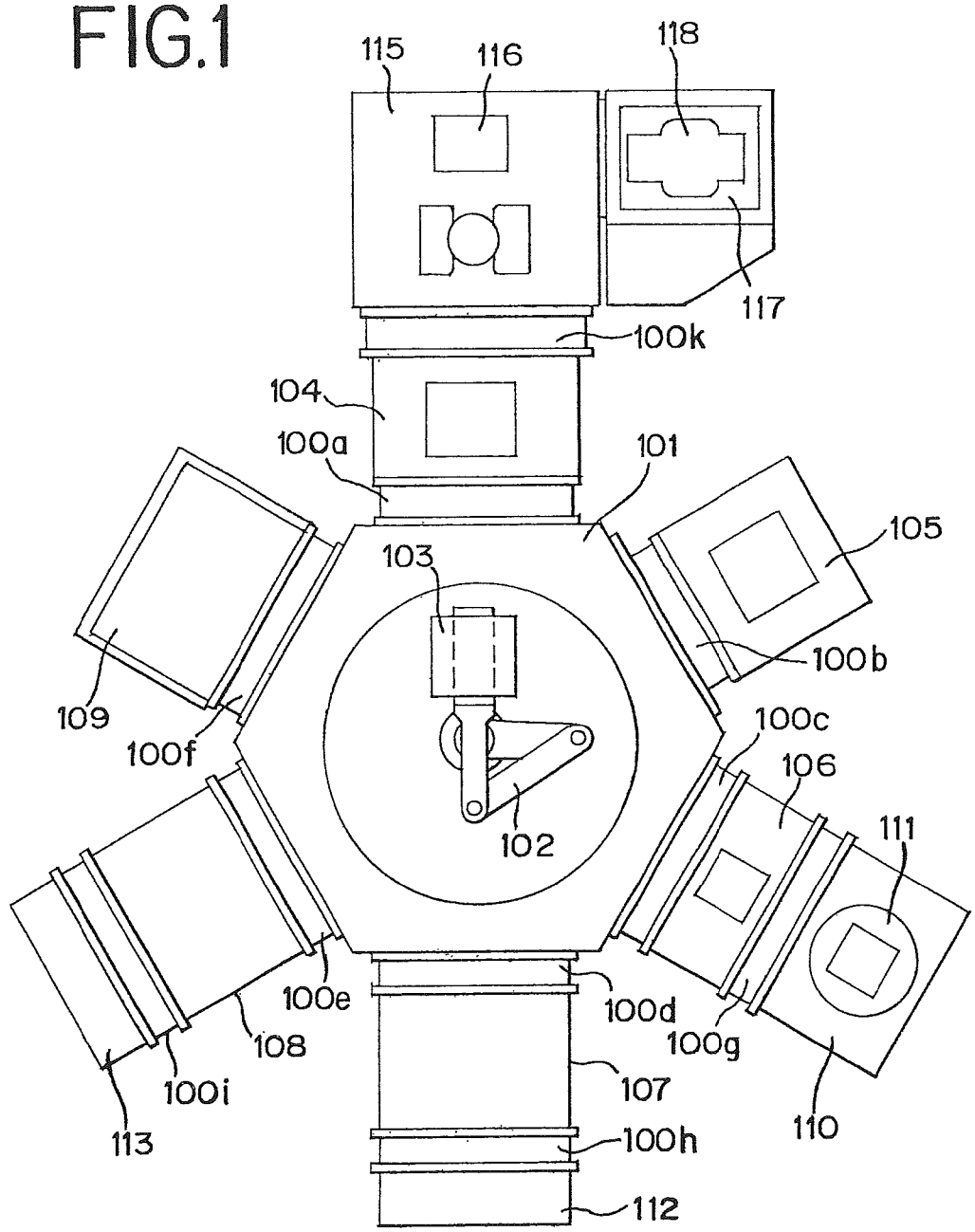
FIG. 1 is a diagram for explaining the structure of a manufacturing apparatus of the present invention.

An example of an apparatus for manufacturing a light emitting device capable of reducing the concentration of impurities contained in organic compounds, such as oxygen and moisture, is explained using FIG. 1. FIG. 1 shows an apparatus for performing film formation and sealing of layers made from organic compounds and a cathode. A conveyor chamber 101 is coupled to a loading chamber 104, a preprocessing chamber 105, an intermediate chamber 106, a film formation chamber (A) 107, a film formation chamber (B) 108, and a film formation chamber (C) 109 through gates 100*a* to 100*f*. The preprocessing chamber 105 is provided with the aim of dehydrogenation of processing substrates, degasification processing, and improving surface quality, and heat treatment processing within a vacuum or plasma processing using an inert gas becomes possible.

The film formation chamber (A) 107 is a processing chamber mainly for forming a film made from a low molecular weight organic compound by evaporation. The film formation chamber (B) 108 is a processing chamber for film formation of a cathode containing an alkaline metal by evaporation, and the film formation chamber (C) 109 is a processing chamber for forming silicon nitride films, silicon oxynitride films, and the like which become passivation films by high frequency sputtering with a substrate temperature set to the room temperature. The film formation chamber (A) 107 and the film formation chamber (B) 108 are connected through the gates 100*h* and 100*i* to material exchange chambers 112 and 113, respectively, loaded with materials used as evaporation sources. The material exchange chambers 112 and 113 are used in order to fill the film formation chamber (A) 107 and the film formation chamber (B) 108 with materials used for evaporation without exposure to the atmosphere.

A substrate 103 on which films are to deposited is mounted in the load chamber 104, and moved to the preprocessing chamber and each film formation chamber by a conveyor mechanism (A) 102 in the conveyor chamber 101. The loading chamber 104, the conveyor chamber 101, the preprocessing chamber 105, the intermediate chamber 106, the film formation chamber (A) 107, the film formation chamber (B) 108, the film formation chamber (C) 109, and the material exchange chambers 112 and 113 are maintained in a reduced pressure state by an evacuating means. The evacuating means performs vacuum evaporation from atmospheric pressure to a pressure on the order of 1 Pa by using an oil free dry pump, and greater pressure reductions may be achieved by performing vacuum evacuation using a turbo molecular pump or a compound molecular pump. A cryo-pump may also be established in the film formation chambers in order to remove moisture. Back diffusion of oil vapor from the evacuating means is thus prevented, and the purity of organic compound layers is increased.

Inner wall surfaces of the vacuum exhausted chambers undergo specular processing by electrolytic polishing, to decrease the surface area, thereby preventing gas emission. Stainless steel or aluminum is used as the inner wall material. It is preferable to place heaters on the outside of the film formation chambers, and to perform baking, with a goal of reducing gas emission from the inner walls. Gas emission can be greatly reduced by the baking process. In addition, cooling using a refrigerant may also be performed during evaporation in order to prevent impurity contamination due to gas emission. A vacuum of up to $1\times10^{-6}$ Pa can thus be achieved.

The intermediate chamber 106 is connected to an application chamber 110 provided with a spinner 111 through the gate 100g. The application chamber 110 is a processing chamber mainly for forming films of organic materials made from high molecular weight materials spin coating, and processing is performed under atmospheric pressure. Therefore, the substrate is carried in and out of the application chamber 110 through the intermediate chamber 106, and this is performed by regulating the pressure to be the same as that of the chamber to which the substrate is being moved. High molecular weight organic materials to be supplied to the application chamber are purified by dialysis, electrodialysis, or high speed liquid chromatography and then supplied. Purification is performed at a supply port.

Gas emission processing performed by heat treatment, and surface processing performed by using an argon plasma are conducted in the preprocessing chamber 105 as preprocesses for the substrate to be introduced to the film formation chambers to sufficiently reduce impurities emitted from the substrate. The impurities emitted from the substrate are gaseous components, moisture, organics, and the like adsorbed to the surface of the substrate. Contamination is reduced by heating the substrate in the preprocessing chamber 105, performing degasification processing, or by performing plasma processing to increase the density of the surface. Nitrogen gas and argon gas introduced to reaction chambers are purified by a purifying means using a gettering material.

Evaporation is a resistive heating method, and a Knudsen cell may also be used in order to control temperature and the amount of evaporation with high precision. Materials used for evaporation are introduced from dedicated material exchange chambers incidental to the reaction chambers. Exposure of the reaction chambers to the atmosphere can thus be avoided as much as possible. Various gasses such as moisture are adsorbed to the inner walls by exposing the film formation chambers to the atmosphere, and these gasses are re-emitted due to vacuum exhaustion. The time required until emission of the adsorbed gasses is finished and the vacuum level stabilizes at an equilibrium value is from several hours to several hundreds of hours. An effective countermeasure is to reduce the time by baking the walls of the film formation chambers. However, this is not an effective technique when there is repeated exposure to the atmosphere, and therefore it is preferable to provide a dedicated material exchange chamber as shown in FIG. 1. The evaporation source is mainly an organic material, and purification is performed within a reaction chamber by sublimation before performing evaporation. Further, purification may also be performed by using a zone melting method.

On the other hand, a sealing chamber 115 delimited by the loading chamber 104 seals the substrate, after processing up through cathode formation is completed, by using a sealing material without exposure to the atmosphere. An ultraviolet light irradiation mechanism 116 is used for cases in which the sealing material is hardened by an ultraviolet setting resin. A conveyor mechanism (B) 118 is provided in a delivery chamber 117, and the substrate subjected to sealing in the sealing chamber 115 is stored in the delivery chamber 117.

Figure 2:
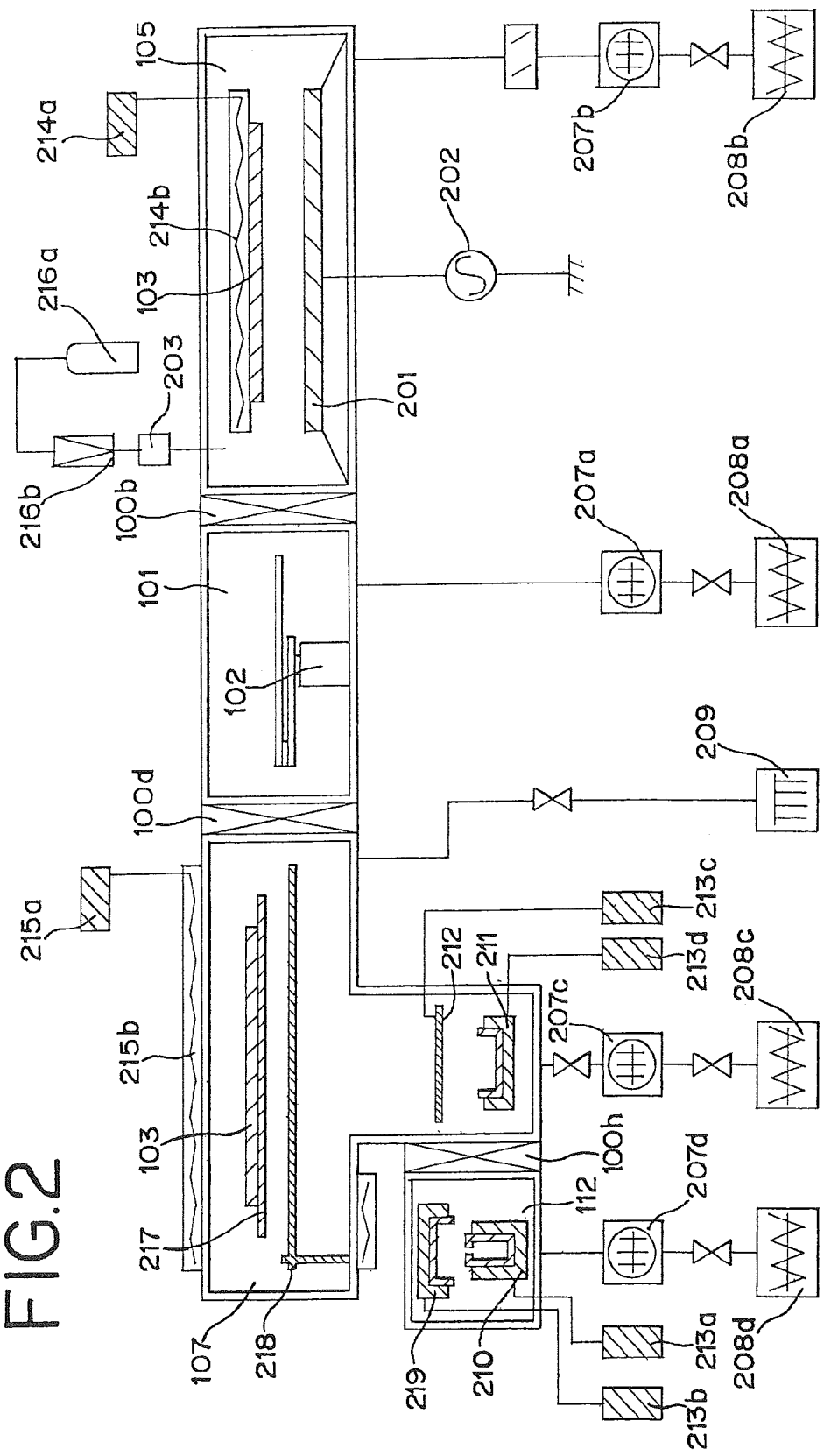
FIG. 2 is a diagram for explaining the structure of a film formation apparatus of the present invention.

FIG. 2 is a diagram for explaining the detailed structure of the conveyor chamber 101 the preprocessing chamber 105 and the film formation chamber (A) 107. The conveyor mechanism 102 is provided in the conveyor chamber 101. The exhausting means of the conveyor chamber 101 is performed by a compound molecular pump or a turbo molecular pump 207a and a dry pump 208a. The preprocessing chamber 105 and the film formation chamber 107 are coupled to the conveyor chamber 101 by the gates 100b and 100d, respectively. An emission electrode 201 and a high frequency electric power source 202 connected to the emission electrode 201 are provided in the preprocessing chamber 105, and the substrate 103 is held to an opposing electrode provided to a substrate heating means 214. Impurities such as moisture adsorbed onto the substrate 103 or onto structures on the substrate 103 can be desorbed by performing heat treatment under a vacuum or under a reduced pressure to a temperature on the order of 50 to 120° C. using the substrate heating means 214. A gas introducing means connected to the preprocessing chamber 105 is made from a purifier 203 having a cylinder 216a, a flow regulator 216b, a gettering material, and the like.

Surface processing using a plasma is performed by purifying an inert gas such as helium, argon, krypton, or neon, or a combined gas of an inert gas and hydrogen, using the purifier 203, applying high frequency electric power, and exposing the substrate within the plasma atmosphere. It is preferable that the purity of the gas used be such that the concentration of $CH_4$, CO, $CO_2$, $H_2O$, and $O_2$ each be equal to or less than 2 ppm, more preferably equal to or less than 1 ppm.

The evacuating means performs evacuation by using a turbo molecular pump 207b or a dry pump 208b. Pressure control within the preprocessing chamber 105 during surface processing is performed by controlling the evacuation speed using a control valve prepared in the evacuating means.

The film formation chamber 107 is prepared with an evaporation source 211, an adsorption plate 212, a shutter 218, and a shadow mask 217. A shutter 218 is an open and close type, and is open during evaporation. The evaporation source 211 and the adsorption plate 212 are for controlling temperature, and are connected to heating means 213d and 213c, respectively. An evacuation system includes the turbo molecular pump 207c and the dry pump 208c, and, a cryo-pump 209 is further added making it possible to remove moisture remaining within the film formation chamber. Baking processing is performed and it becomes possible to reduce the amount of gas emitted from the walls within the reaction chamber. Baking is performed by vacuum evacuation using the evacuation system, to which the turbo molecular pump and the cryo-pump are connected, while heating the film formation chamber to a temperature on the order of about 50 to 120° C. It is possible to perform vacuum evaporation to a pressure on the order of $1\times10^{-6}$ Pa by cooling the reaction chamber to the room temperature or to a temperature on the order of liquid nitrogen by using a refrigerant.

Evaporation sources 210 and 219 are provided in the material exchange chamber 112 delimited by the gate 100h, and this becomes a mechanism in which temperature is controlled by heating means 213a and 213b. A turbo molecular pump 207d and a dry pump 208d are used in the evacuation system. The evaporation source 219 is moveable between the material exchange chamber 112 and the film formation chamber 107, and is used as a means for performing purification of the evaporation material to be supplied.

There are no limitations placed on the method of purifying the evaporation materials, but it is preferable to employ a sublimation purification method when performing purification within the manufacturing apparatus. A zone purification method may also be performed, or course.

An organic light emitting element manufactured by using the manufacturing apparatus explained with reference to FIG. 1 and FIG. 2 is not limited in structure. Organic light emitting elements are formed by forming a layer made from organic compounds between an anode composed of a transparent conductive film and a cathode which contains an alkaline metal. The layer made from organic compounds may be formed by a single layer or a lamination of a plurality of layers. A distinction is made between each layer based upon the aim and function of the layer, and the layers are referred to as hole injecting layers, hole transporting layers, light emitting layers, electron transporting layers, electron injecting layers, and the like. It is possible to form these layers by using low molecular weight organic compound materials, intermediate molecular weight organic compound materials, high molecular weight organic compound materials, or a mixture of suitable amounts of these materials. Further, a mixed layer in which an electron transporting material and a hole transporting material are suitably mixed may also be formed, as may a mixed junction in which a mixed region is formed in junction boundaries of an electron transporting material and a hole transporting material.

Organic compound materials having superior hole transporting characteristics are selected for hole injecting layers and hole transporting layers, and typically a phthalocyanine or an aromatic amine material is employed. Further, metallic chains and the like having superior electron transporting characteristics are used in electron injecting layers.

Figure 5A:
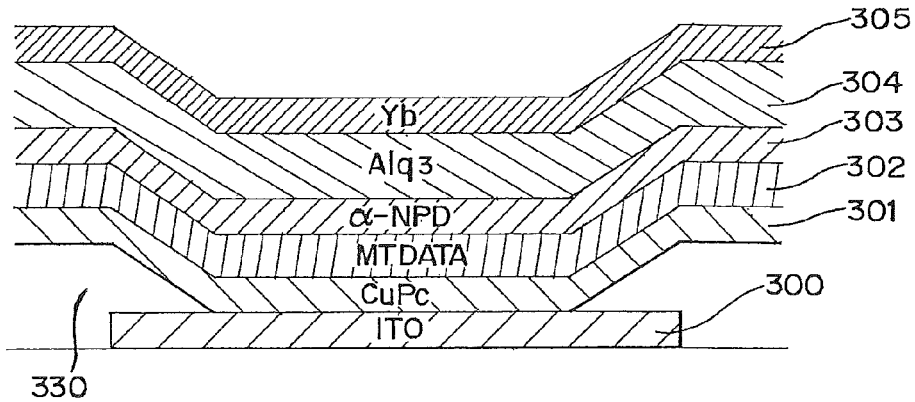
FIGS. 5A to 5C are diagrams for explaining the structure of a light emitting element.
Figure 5B:
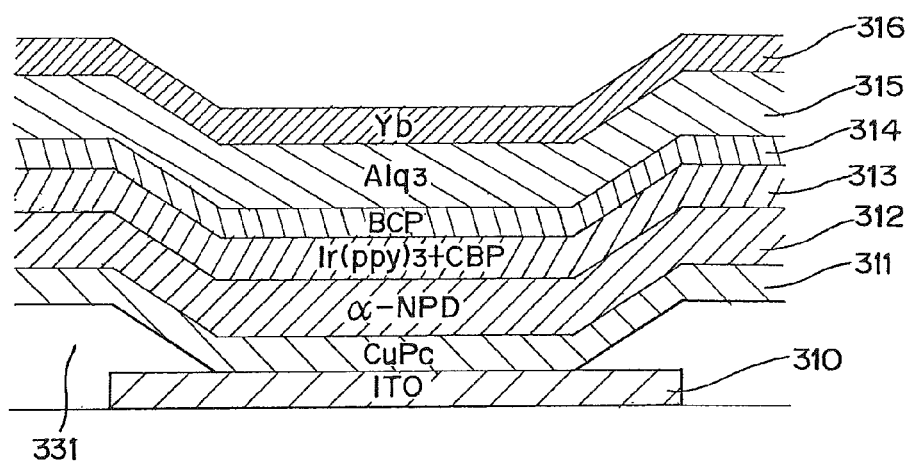
Figure 5C:
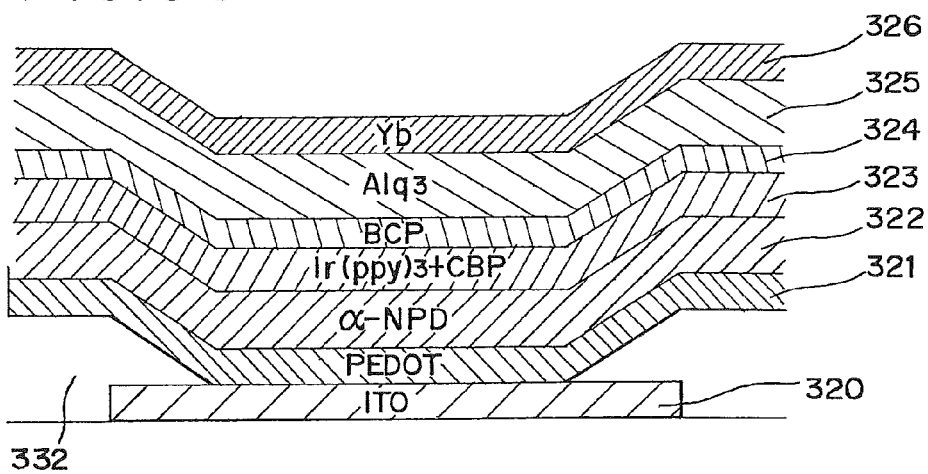

An example of the structure of an organic light emitting element is shown in FIGS. 5A to 5C. FIG. 5A is an example of an organic light emitting element using low molecular weight organic compounds. An anode 300 formed by indium tin oxide (ITO), a hole injecting layer 301 formed by copper phthalocyanine (CuPc), a hole transporting layers 302 and 303 formed by MTDATA and α-NPD which are aromatic amine materials, a combination electron injecting and light emitting layer 304 formed by tris-8-quinolinolate aluminum complex ($Alq_3$), and a cathode 305 made from ytterbium (Yb) are laminated. Light emission (fluorescent light) of $Alq_3$ is possible from a singlet excitation state. Further, a partitioning layer 330 covering an edge portion of the anode 300 is formed by an inorganic insulating material such as silicon nitride.

It is preferable to use light emission from a triplet excitation state (phosphorescence) in order to increase brightness. An example of that type of element structure is shown in FIG. 5B. An anode 310 formed by ITO, a hole injecting layer 311 formed by CuPc which is a phthalocyanine material, a hole transporting layer 312 formed by α-NPD which is an aromatic amine material, and a light emitting layer 313 formed on the hole transporting layer 312 using CBP+Ir(ppy)$_3$ which is a carbazole, are formed. In addition, the structure has a hole blocking layer 314 formed by using vasocuproin (BCP), an electron injecting layer 315 formed from $Alq_3$, and a cathode 316 containing an alkaline metal such as ytterbium (Yb) or lithium. Furthermore, a blocking layer 331 covering an edge portion of an anode 310 is formed by using an inorganic insulating material such as silicon nitride.

The above-mentioned two structures are examples of using low molecular weight organic compounds. Organic light emitting elements can also be achieved by combining high molecular weight organic compounds and low molecular weight organic compounds. FIG. 5C is an example thereof, and an anode 320 is formed by ITO, on which a hole injecting layer 321 is formed by the high molecular weight organic compound polythiophene derivative (PEDOT), a hole transporting layer 322 is formed by α-NPD, a light emitting layer 323 is formed by CBP+Ir(ppy)$_3$, a hole blocking layer 324 is formed by BCP, an electron injecting layer 325 is formed by $Alq_3$, and a cathode 326 containing an alkaline metal such as ytterbium (Yb) or lithium is formed. The hole injecting characteristics of the hole injecting layer are improved by changing to PEDOT, and the light emitting efficiency can be increased. Further, a blocking layer 332 covering an edge portion of an anode 320 is formed using an inorganic insulating material such as silicon nitride.

The carbazole CBP+Ir(ppy)$_3$ used as the light emitting layer is an organic compound capable of obtaining light emission from a triplet excitation state (phosphorescence). The organic compounds discussed in the following papers can be given as typical triplet compound materials. (1) T. Tsutsui, C. Adachi, S. Saito, Photochemical Processes in Organized Molecular Systems, ed. K. Honda, (Elsevier Sci. Pub., Tokyo, 1991) p. 437. (2) M. A. Baldo, D. F. O'Brien, Y. You, A. Shoustikov, S. Sibley, M. E. Thompson, S. R. Forrest, Nature 395 (1998) p. 151. In this essay, the organic compound represented by the following formula is disclosed. (3) M. A. Baldo, S. Lamansky, P. E. Burrrows, M. E. Thompson, S. R. Forrest, Appl. Phys. Lett, 75 (1999) p. 4. (4) T. Tsutsui, M.-J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

Whichever type of material is used, light emission from a triplet excitation state (phosphorescence) has higher light emission efficiency than light emitted from a singlet excitation state (fluorescence), and it is thus possible to reduce the operating voltage (the voltage required in order to make the organic light emitting element emit light) and obtain the same brightness in the emitted light.

The phthalocyanine CuPc, the aromatic amine α-NPD, MTDATA, the carbazole CBP and the like are organic compounds which do not contain oxygen. A change in bonding state occurs like that explained using the chemical equations Chem. 4 and Chem. 5 due to mixture of oxygen or moisture into these organic compounds, and the hole transporting characteristics and the light emitting characteristics are degraded. The manufacturing apparatus explained by using FIG. 1 and FIG. 2 is employed in forming layers of organic compounds described above. The concentration of oxygen within the light emitting element can thus be reduced to be equal to or less than $1\times10^{19}/cm^3$. In addition, the concentration of oxygen can also be reduced to be equal to or less than $1\times10^{19}/cm^3$ in hole injecting layers and hole transporting layers in organic light emitting elements having a phthalocyanine or an aromatic amine hole injecting layer or hole transporting layer, and a carbazole light emitting layer.

Note that, although not shown in FIGS. 5A to 5C, there are interfaces between the materials used to form the layers such as the light emitting layer, the hole injecting layer, the electron injecting layer, the hole transporting layer, and the electron transporting layer, and an embodiment can be made in which the materials from a plurality of layers are mixed. High molecular compounds such as polyparaphenylene vinylenes, polyparaphenylenes, polythiofenes, polyfluorenes, and the like may also be used for the organic compound layers. In addition to the embodiment in which each layer is formed using an organic compound, inorganic compounds may also be used for the hole injecting and transporting layers and the electron injecting and transporting layers. Inorganic compound materials include diamond like carbon (DLC), carbon nitride, Si, Ge, and oxide and nitrides of these materials. Materials in which P, B, N, or the like is suitably doped may also be used. Further, dioxides, nitrides, and fluorides of alkaline metals or alkaline earth metals may be used, and chemical compounds and alloys of alkaline metals and alkaline earth metals and at least Zn, Sn, V, Ru, Sm, and In may also be used.

Figure 6:
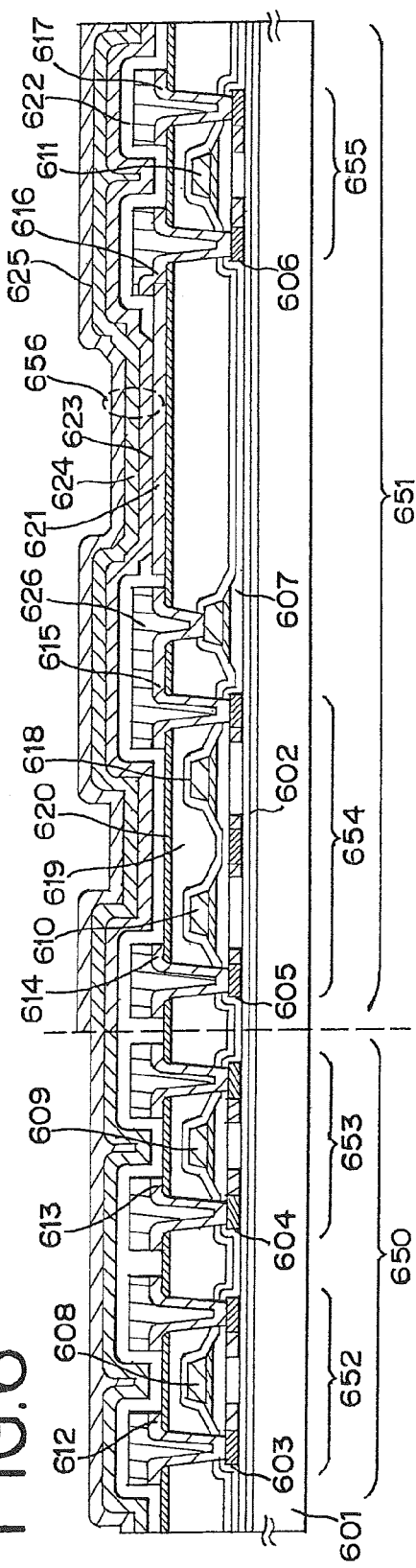
FIG. 6 is a partial cross sectional diagram for explaining the structure of a light emitting device prepared with a pixel portion and a driver circuit portion.

FIG. 6 is an example showing the structure of an active matrix drive light emitting device. TFTs are formed in a pixel portion and in various kinds of functional circuits in the periphery of the pixel portion. It is possible to select amorphous silicon or polycrystalline silicon as semiconductor film materials used in forming channel forming regions of the TFTs, and the present invention may employ either material.

A substrate 601 employs a glass substrate or an organic resin substrate. Organic resin materials are light weight compared to glass materials, and are effective in making the light emitting device itself light weight. Organic resin materials such as polyimide, polyethylene terephthalate (PET), polyethylene naphthalene (PEN), polyether sulfone (PES) and aramid are materials capable of being applied to manufacture of the light emitting device. Glass substrates are referred to as non-alkaline glass, and it is preferable to use barium borosilicate glass or aluminum borosilicate glass. A thickness of 0.5 to 1.1 mm is employed for the glass substrate, and it is necessary to make the thickness small in order to achieve light weight. Further, it is preferable to use a glass substrate having a low specific gravity of 2.37 g/cc in order to achieve even lighter weight.

A state is shown in FIG. 6 in which an n-channel TFT 652 and a p-channel TFT 653 are formed in a driver circuit portion 650, and a switching TFT 654 and an electric current control TFT 655 are formed in a pixel portion 651. These TFTs are formed using semiconductor films 603 to 606, a gate insulating film 607, gate electrodes 608 to 611, and the like on a first insulating film 602 made from silicon oxide, silicon nitride, or a silicon oxynitride laminate.

A second insulating film 618 made from silicon nitride or silicon oxynitride is formed on the gate electrodes, and is used as a protective film. In addition, an organic insulating film 619 made from polyimide or acrylic is formed as a leveling film. This organic insulating film has hygroscopic characteristics, and possesses property of occluding moisture. Oxygen is supplied to the organic compounds if moisture is remitted, and becomes a cause of degradation of the organic light emitting element. A third insulating film 620 formed by an inorganic insulating material selected from silicon nitride, silicon oxynitride, aluminum oxynitride, aluminum nitride, and the like is therefore formed on the organic insulating film 619 in order to prevent moisture occlusion and reemission.

The circuit structure of the driver circuit portion 650 differs between a gate signal line side driver circuit and a data signal line side driver circuit, but this difference is omitted here. Wirings 612 and 613 are connected to the n-channel TFT 652 and the p-channel TFT 653, and it is possible to form a shift register, a latching circuit, a buffer circuit, and the like by using these TFTs.

A data wiring 614 is connected to a source side of the switching TFT 654, and a drain side wiring 615 is connected to the gate electrode 611 of the electric current control TFT 655 in the pixel portion 651. Further, a source side of the electric current control TFT 655 is connected to an electric current supply wiring 617, and a drain side electrode 616 is wired such that it is connected to an anode of an organic light emitting element.

An organic light emitting element 656 is made from an anode 621 formed on the third insulating film 620 by ITO (indium tin oxide), an organic compound layer 623 containing a hole injecting layer, a hole transporting layer, a light emitting layer, and the like, and a cathode 624 formed by using a material containing an alkaline metal or an alkaline earth metal such as MgAg, LiF, crystalline semiconductor film, BaF, or CaF. The structure of the organic light emitting element may be arbitrary, and the structure shown in FIG. 5 can be employed.

A partitioning layer 622 is formed by a nitride inorganic insulating material. Specifically, the partitioning layer 622 is formed by an inorganic insulating material selected from silicon nitride, aluminum nitride, and aluminum oxynitride. The partitioning layer 622 is formed at a thickness on the order of 0.1 to 1 μm, and is formed so that an edge portion overlapping with the anode 621 has a tapered shape. The partitioning layer 622 is formed so as to cover the upper and side surfaces of a photo resist 626 remaining on the wirings 612 to 617. Further, although not shown in the figure, an insulating film having a thickness of 0.5 to 5 mm, an order at which a tunneling electric current will flow, may also be formed in the interface between the anode 621 and the organic compound layer 623. The insulating film is effective in preventing short circuits caused by roughness in the surface of the anode, and in deterring alkaline metals and the like used in the cathode from diffusing to the lower layer side.

The cathode 624 of the organic light emitting element uses a material containing magnesium (Mg), lithium (Li) or calcium (Ca), each having a small work function. An MgAg (a material in which Mg and Ag are mixed at a ratio of Mg::Ag=10::1) electrode is preferably used. MgAgAl electrodes, LiAl electrodes, and LiFAl electrodes can be given as other examples. In addition, a fourth insulating film 625 is formed on the cathode 624 by using an inorganic insulating material selected from silicon nitride, DLC, aluminum oxynitride, aluminum oxide, aluminum nitride, and the like. DLC films are known to have high gas barrier characteristics to oxygen, CO, $CO_2$, $H_2O$, and the like. It is preferable to form the fourth insulating film 625 in succession, without exposure to the atmosphere, after forming the cathode 624. A silicon nitride partitioning layer may also be used as a lower layer of the fourth insulating film 625. This is because the state of the interface between the cathode 624 and the organic compound layer 623 is known to exert a great influence on the light emitting efficiency of the organic light emitting element.

The switching TFT 654 uses a multi-gate structure in FIG. 6, and a low concentration drain (LDD) overlapping with the gate electrode is formed in the electric current control TFT 655. TFTs using polycrystalline silicon performs a high operating speed, and therefore degradation due to hot carrier injection and the like occurs easily. Therefore, as shown in FIG. 6, the formation of TFTs having different structures, corresponding to their function within a pixel (a switching TFT having a sufficiently low off current, and an electric current control TFT which is strong with respect to hot carrier injection), is therefore extremely effective in manufacturing a display device having high reliability and capable of good image display (high operating efficiency).

The first insulating film 602 is formed on the lower side of the semiconductor film which forms the TFTs 654 and 655, as shown in FIG. 6. The second insulating film 618 is formed on the opposite upper layer side. On the other hand, the third insulating film 620 is formed on the lower layer side of the organic light emitting element 656, and further, the partitioning layer 622 is formed therebetween. These films are all formed by inorganic insulating materials. The organic light emitting element 656 is formed within these films, sandwiched by the third insulating film 620, the fourth insulating film 625, and the partitioning layer 622, and is unified with these films.

The substrate 601 and the organic light emitting element 656 can be considered as sources of contamination of alkaline metal, such as sodium, with respect to the TFTs 654 and 655, but the contamination can be prevented by surrounding the TFTs using the first insulating film 602 and the second insulating film 618. On the other hand, the organic light emitting element 656 most dislikes oxygen and moisture, and therefore the third insulating film 620, the fourth insulating film 625, and the partitioning layer 622 are formed by inorganic insulating materials. These films also function so that alkaline metal elements in the organic light emitting element 656 do not go outside.

In particular, one example of a material appropriate for use in forming the third insulating film 620, the partitioning layer 622, and the fourth insulating film 625 is a silicon nitride film manufactured by sputtering using silicon as a target. Specifically, the silicon nitride film has extremely compact film qualities when formed by high frequency sputtering, and is formed by the process conditions shown in FIG. 20 (typical examples are also included in FIG. 20). Note that the term "RFSP-SiN" within FIG. 20 indicates a silicon nitride film formed by high frequency sputtering. Further the term "T/S" denotes the distance between the target and the substrate.

Ar is used as the sputtering gas, and is introduced so as to be blown on the rear surface of the substrate as a gas for heating the substrate. $N_2$ is finally mixed in, and contributes to sputtering. Further, the film formation conditions shown in FIG. 20 are typical conditions, and the film formation conditions are not limited by the values shown in FIG. 20. The conditions may be suitably changed by an operator provided that the characteristic parameters of the formed SiN film fall within the characteristic pattern range to be shown later in FIG. 23.

Figure 16:
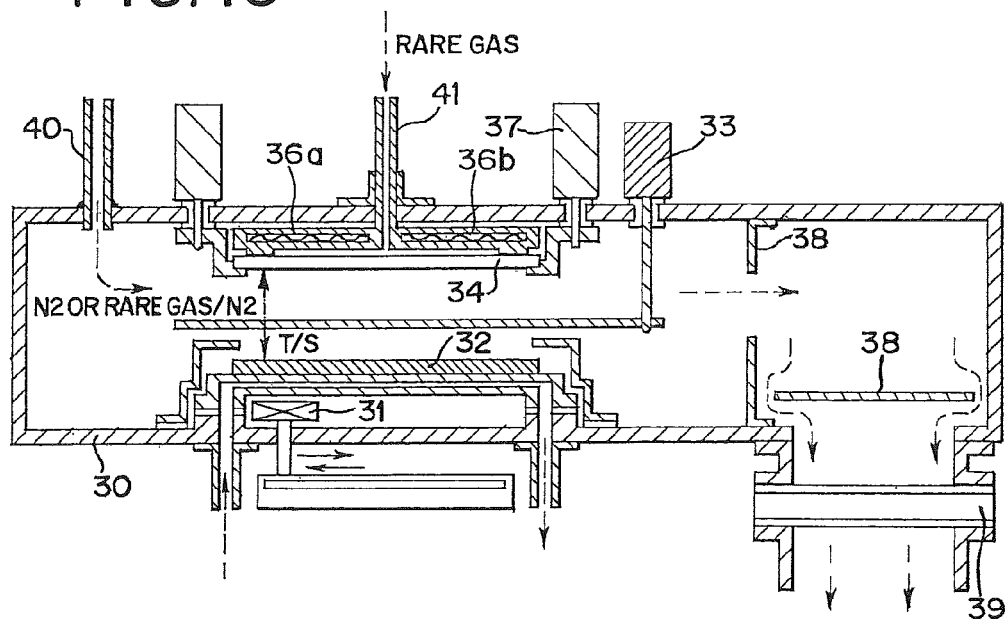
FIG. 16 is a diagram for explaining a sputtering apparatus.
Figure 17:
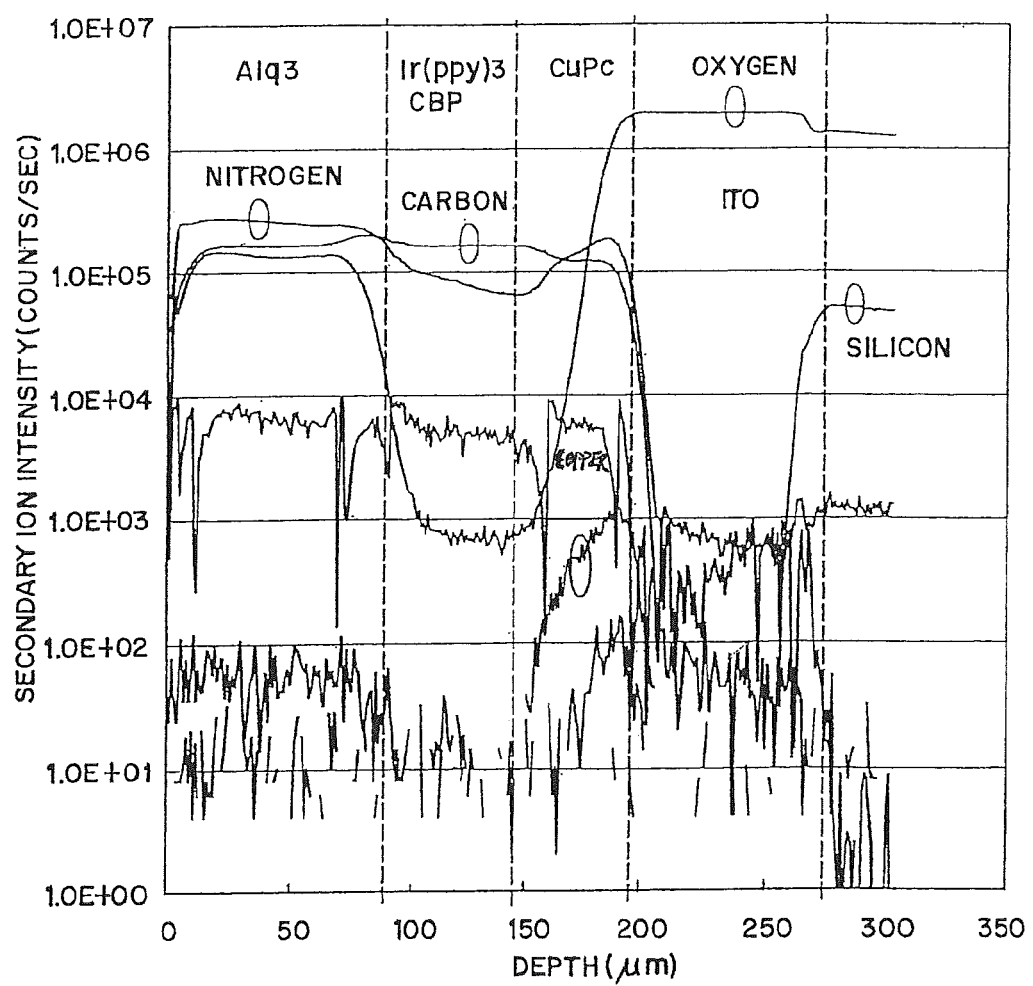
FIG. 17 is a graph showing the distribution in the depth direction of each element of a sample having an $Alq_3$/Ir$(ppy)_3$+CBP/CuPc/ITO structure, obtained by SIMS measurement.
Figure 18A:
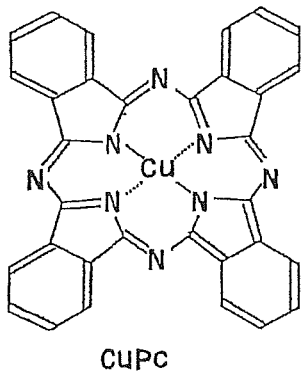
FIGS. 18A to 18E are chemical formulae of organic compounds.
Figure 18B:
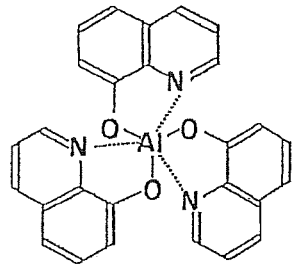
Figure 18C:
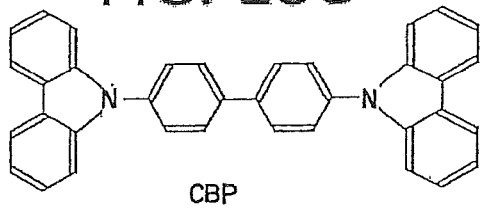
Figure 18D:
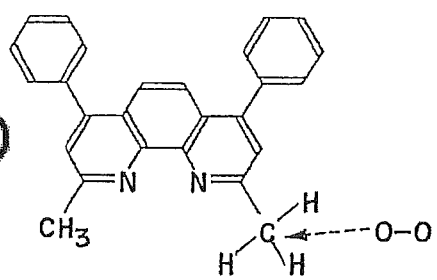
Figure 18E:
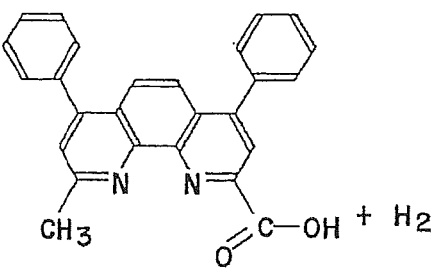

A schematic diagram of a sputtering apparatus used in forming the silicon nitride film by high frequency sputtering is shown in FIG. 16. Reference numeral 30 in FIG. 16 denotes a chamber wall, reference numeral 31 denotes a moveable magnet for forming an electric field, reference numeral 32 denotes a single crystal silicon target, reference numeral 33 denotes a protective shutter, reference numeral 34 denotes a substrate to be processed, reference numerals 36a and 36b denote heaters, reference numeral 37 denotes a substrate fastening mechanism, reference numeral 38 denotes a shield, and reference numeral 39 denotes a valve (conductance valve or main valve). Further, gas introduction pipes 40 and 41 provided in the chamber wall 30 are pipes for introducing $N_2$ (or a mixed gas of $N_2$ and an inert gas) and an inert gas, respectively.

Further, film formation conditions for a silicon nitride film formed by conventional plasma CVD are shown in FIG. 21. Note that the term "PCVD-SiN" within FIG. 21 indicates a silicon nitride film formed by plasma sputtering.

Next, typical characteristic values (characteristic parameters) of silicon nitride films formed under the film formation conditions of FIG. 20 and silicon nitride films formed by the film formation conditions of FIG. 21 are compared, and the results are shown in FIG. 22. Note that the difference between "RFSP-SiN (No. 1)" and "RFSP-SiN (No. 2)" is a difference due to the film formation apparatus, and their function as silicon nitride films used as barrier films of the present invention is not lost. Furthermore, although the reference symbol sign of the numerical values for internal stress change between compressive stress and tensile stress, only absolute values are used here.

Common characteristic points between the RFSP-SiN (No. 1) and the RFSP-SiN (No. 20) are that the etching speed is slow compared to the PCVD-SiN film (etching speed when etching at 20° C. using LAL500; hereafter the same), and that the hydrogen concentration is low. Note that the term "LAL500" denotes the product "LAL 500 SA buffered hydrofluoric acid" manufactured by Hashimoto Chemical KK, and is an aqueous solution of $NH_4HF_2$ (7.13%) and $NH_4F$ (15.4%). Further, the internal stress becomes a smaller value than that for the silicon nitride film formed by plasma CVD when comparing absolute values.

The applicants of the present invention have compiled in FIG. 23 parameters for various physical properties of silicon nitride films formed by the film formation conditions of FIG. 20.

Figure 3:
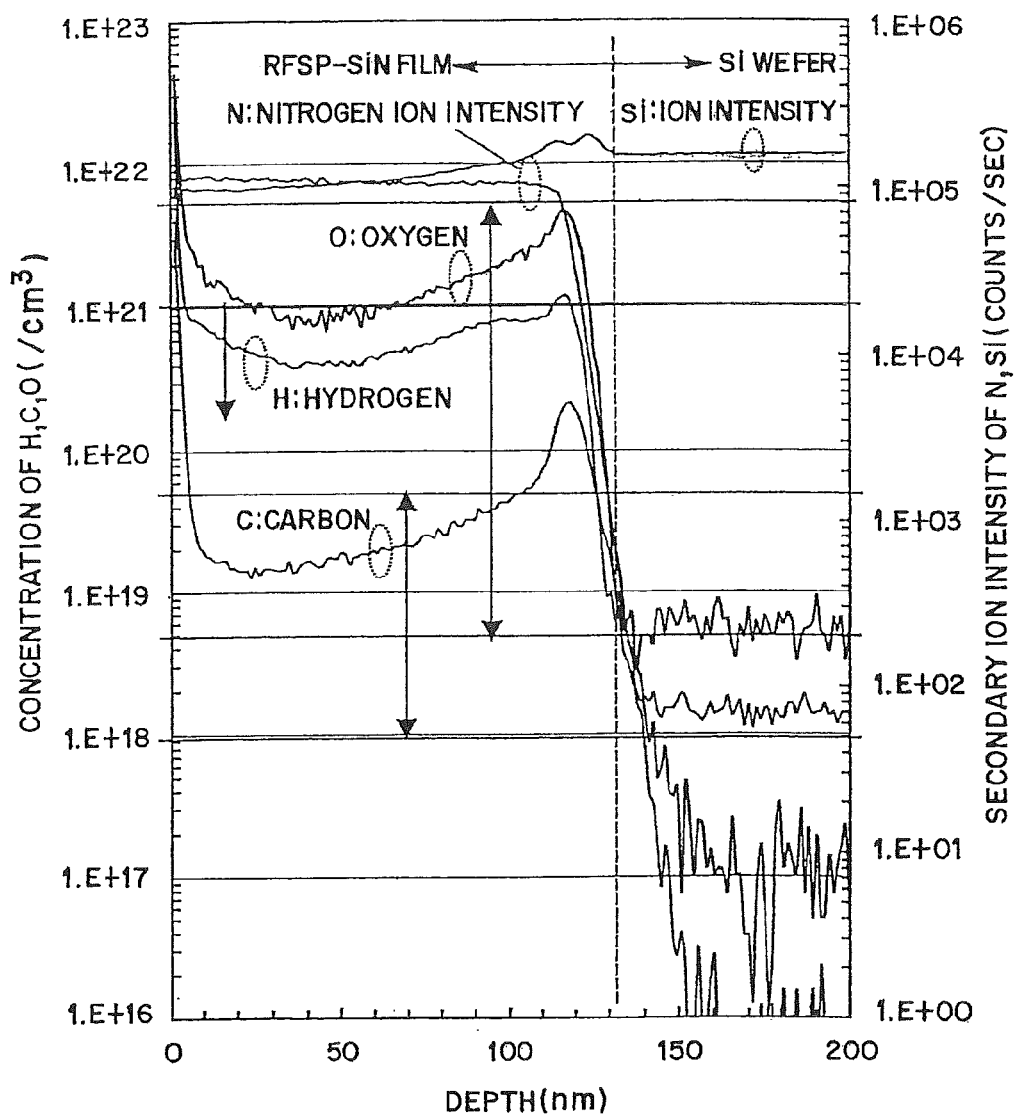
FIG. 3 is SIMS (secondary ion mass spectroscopy) measurement data for a silicon nitride film.
Figure 11:
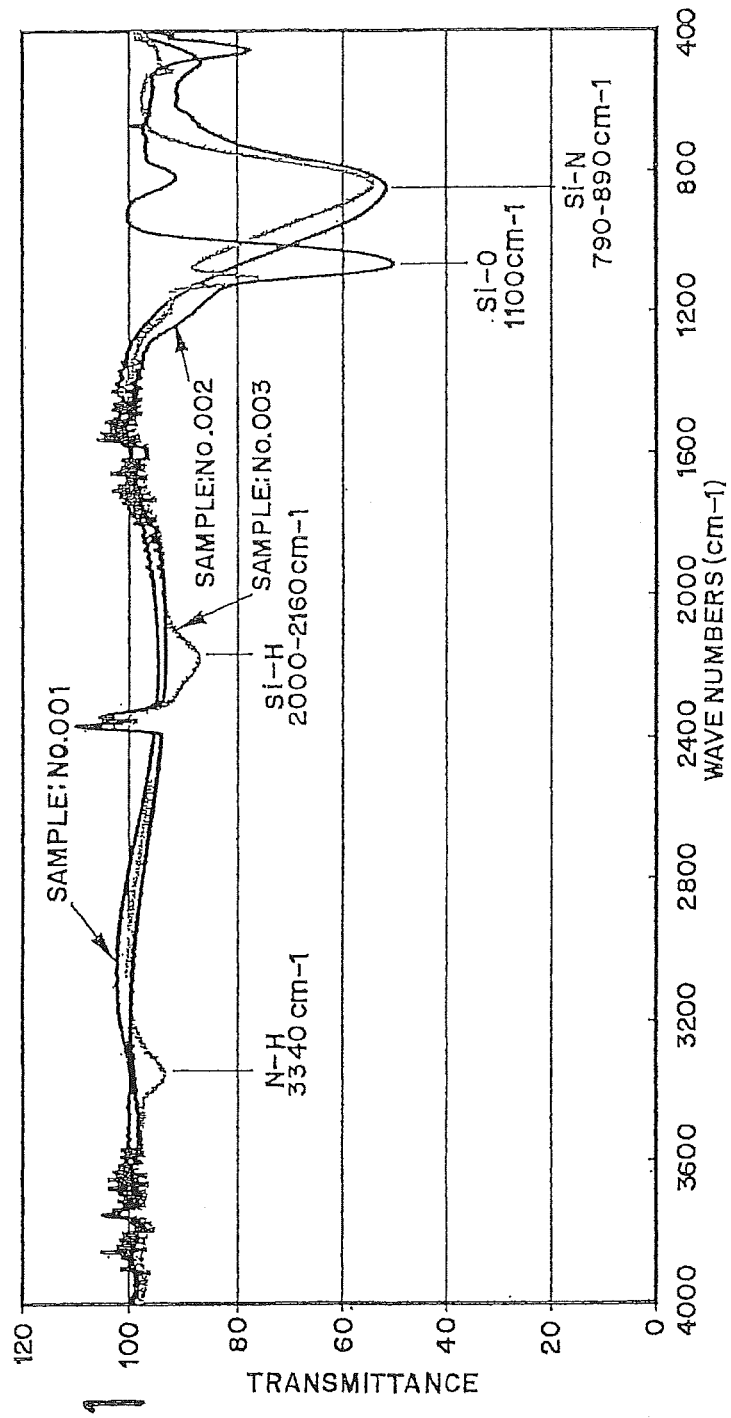
FIG. 11 is FT-IR measurement data of a silicon nitride film.
Figure 12:
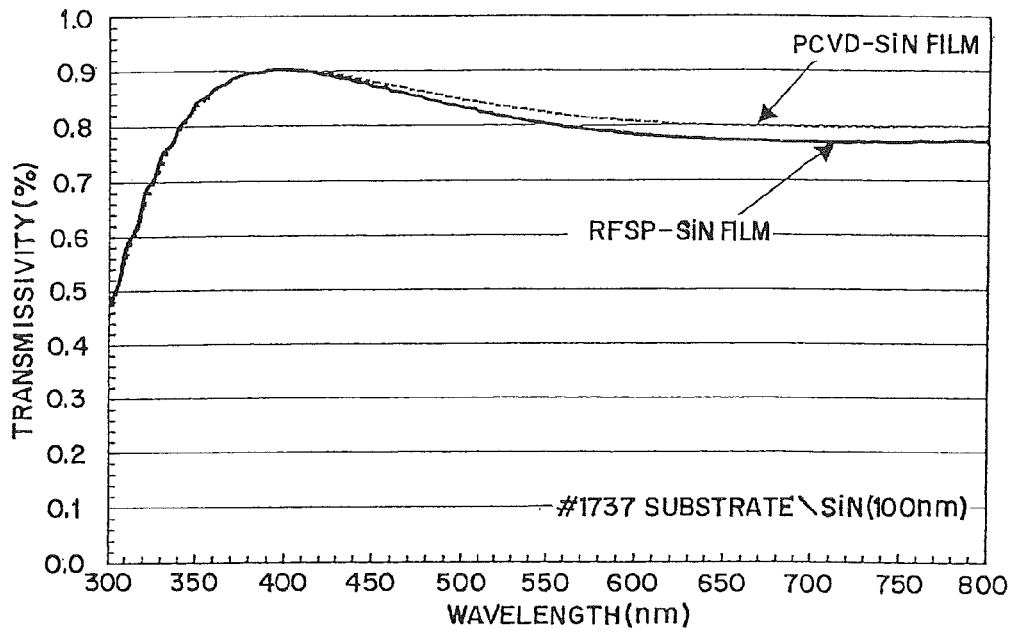
FIG. 12 is measurement data of the transmittivity of a silicon nitride film.

Further, results of investigating the silicon nitride films by SIMS (secondary ion mass spectroscopy) are shown in FIG. 3, and FT-IR results are shown in FIG. 11, and the transmittivity of the silicon nitride films is shown in FIG. 12. Note that the silicon nitride films formed under the film formation conditions of FIG. 21 are also shown in FIG. 12. Regarding transmittivity, there is no inferiority compared to conventional PCVD-SiN films.

FIG. 11 shows an infrared absorption spectrum of a silicon nitride film (#001) formed by sputtering using only a nitrogen gas, and applying high frequency electric power at 13.56 MHz. The main film formation conditions are the use of a 1 to 2 Ωsq. silicon target to which boron is added, the supply of only nitrogen gas, and a high frequency electric power (13.56 MHz) of 800 W. The target size has a diameter of 152.4 mm. Film formation of 2 to 4 nm/min was obtained under these conditions.

The characteristics of a silicon oxide film (#002) manufactured by sputtering and a silicon nitride film (#003) manufactured by plasma CVD are inputted as comparison data in FIG. 11. The film formation conditions of each film are noted within Table 1, and therefore may be referred to. The silicon nitride film denoted by sample number #001 formed at the room temperature is formed using only nitrogen as a sputtering gas, and absorption peaks for N—H bonds and Si—H bonds are not observed. Further, an Si—O absorption peak is also absent in this film. It is understood from these characteristics that the concentration of oxygen and the concentration of hydrogen within the film are equal to or less than 1 atomic %.

TABLE 1

| | Sample No. | | |
|---|---|---|---|
| | #001 (RF-SP SiN) | #002 (RF-SP SiO2) | #003 (PCVD SiN) |
| Rotation of substrate (rpm) | 5 | None | None |
| Temperature of substrate (° C.) | Room Temperature | 150 | 300 |
| Heating gas | None | O2 = 10 sccm | |
| Electric power of film formation (RF) | 800 W | 3 kW | 170 W |
| Pressure of film formation | 0.4 Pa | 0.4 Pa | 1.2 torr |
| Gas flow (sccm) | Ar/O2/N2 = 0/0/40 | Ar/O2/N2 = 35/15/0 | SiH4/NH3/N2/H2 = 30/240/300/60 |
| Film thickness (nm) | 500 | 500 | 500 |

FIG. 4 shows transmittivity for three types of structures on a non-alkaline glass substrate (Corning Corp., substrate #1737): a silicon nitride film, an acrylic resin film, and a laminate of an acrylic resin film and a silicon nitride film. A transmittivity equal to or greater than 80% was found in visible light. In particular, there is a transmittivity equal to or greater than 80% for a wavelength of 400 nm, thus showing the transparent characteristics of this film. This assumes a state in which the organic insulating film 619 and the third insulating film 620 in FIG. 6 are laminated together, and shows that there will be little change in tint, even if light from the organic light emitting element is emitted toward the glass substrate.

In the silicon nitride film used as a inorganic insulating layer of the present invention, a silicon nitride film which satisfies the parameter shown in FIG. 4 is desirable. That is, as the inorganic insulating layer, it is desirable to satisfy any of (1) using a silicon nitride film having an etching rate of 9 nm/min or less (preferably, 0.5 to 3.5 nm/min or less), (2) having a hydrogen concentration of $1\times10^{21}$ atoms/cm$^{-3}$ or less (preferably, $5\times10^{20}$ atoms/cm$^{-3}$ or less), (3) having a hydrogen concentration of $1\times10^{21}$ atoms/cm$^{-3}$ or less (preferably, $5\times10^{20}$ atoms/cm$^{-3}$ or less), and an oxygen concentration of $5\times10^{18}$ to $5\times10^{21}$ atoms/cm$^{-3}$ or less (preferably, $1\times10^{19}$ to $1\times10^{21}$ atoms/cm$^{-3}$ or less), (4) having an etching rate of 9 nm/min or less (preferably, 0.5 to 3.5 nm/min or less), and a hydrogen concentration of $1\times10^{21}$ atoms/cm$^3$ or less (preferably, $5\times10^{20}$ atoms/cm$^{-3}$ or less), and (5) having an etching rate of 9 nm/min or less (preferably, 0.5 to 3.5 nm/min or less), a hydrogen concentration of $1\times10^{21}$ atoms/cm$^3$ or less (preferably, $5\times10^{20}$ atoms/cm$^{-3}$ or less), and an oxygen concentration of $5\times10^{18}$ to $5\times10^{21}$ atoms/cm$^{-3}$ or less (preferably, $1\times10^{19}$ to $1\times10^{21}$ atoms/cm$^{-3}$ or less).

Further, the absolute value of the internal stress may be set equal to or less than $2\times10^{10}$ dyn/cm$^2$, preferably equal to or less than $5\times10^9$ dyn/cm$^2$, and more preferably equal to or less than $5\times10^8$ dyn/cm$^2$. Level generation in interfaces with other films can be reduced if the internal stress is made smaller. In addition, film peeling due to internal stress can be prevented.

Furthermore, the blocking effect against Na, Li, and other elements residing in group 1 and group 2 of the periodic table is extremely strong in the silicon nitride film formed in accordance with the film formation conditions of FIG. 20 disclosed in this embodiment mode. The diffusion of these mobile ions and the like can be effectively suppressed. For example, a metallic film in which 0.2 to 1.5 wt % (preferably 0.5 to 1.0 wt %) of aluminum is added to lithium is preferable in its electron injecting characteristics and other characteristics when used as a cathode layer in this embodiment mode, although in this case there is concern that the diffusion of lithium will adversely affects transistor operation. However, there is complete protection by the inorganic insulating layers in this embodiment mode, and therefore it is not necessary to worry about the diffusion of lithium in the direction of the transistors.

Figure 13:
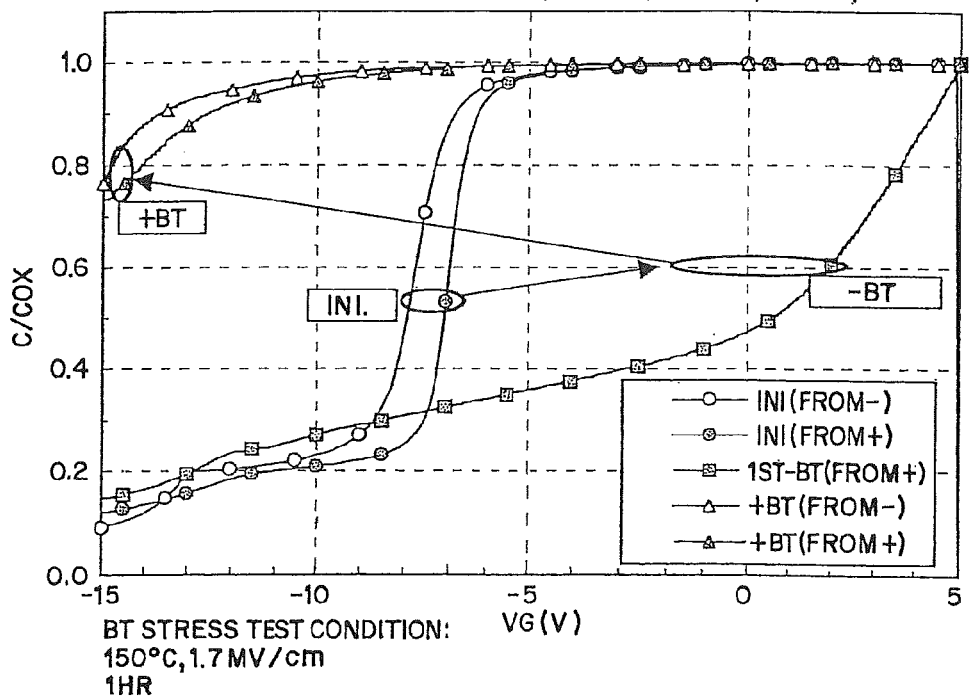
FIG. 13 shows C-V characteristics of a MOS structure before and after a BT stress experiment thereon.

Data showing this fact is shown in FIGS. 13 to 15B. FIG. 13 is a diagram showing the change in the C-V characteristics before and after BT stress tests on a MOS structure in which a silicon nitride film formed by the film formation conditions of FIG. 21 (PCVD-SiN film) is used as a dielectric. The structure of a sample is as shown in FIG. 15A, and the presence or absence of influence due to lithium diffusion can be ascertained by using an Al—Li (aluminum to which lithium is added) electrode in a surface electrode. According to FIG. 13, the C-V characteristics shift greatly due to the BT stress test, and it can be confirmed that influence due to the diffusion of lithium from the surface electrode clearly appears.

Figure 14A:
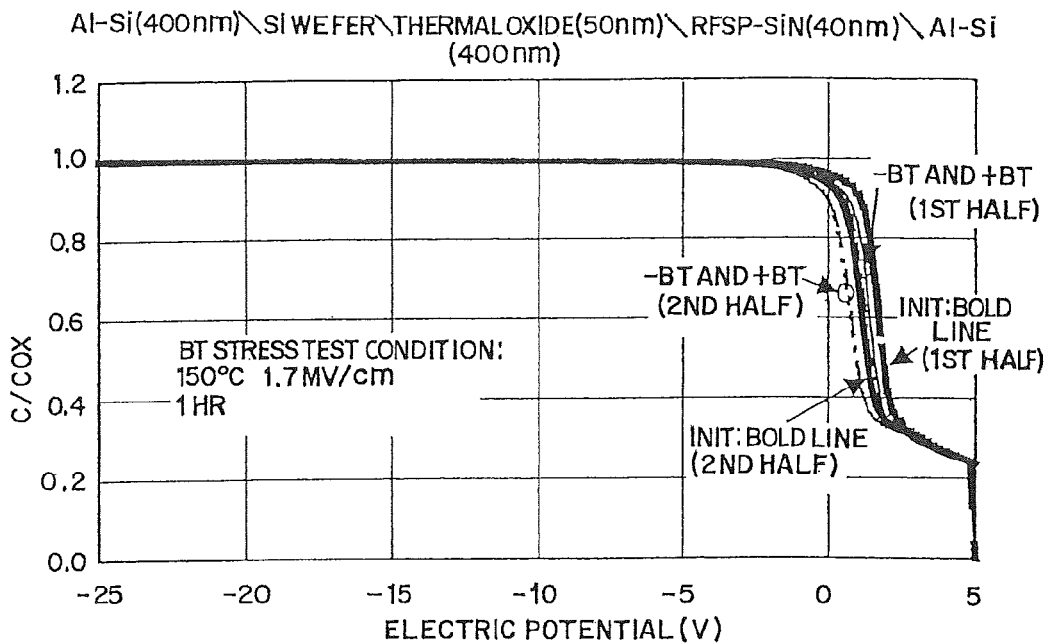
FIGS. 14A and 14B show the C-V characteristics of the MOS structure before and after a BT stress experiment thereon.
Figure 14B:
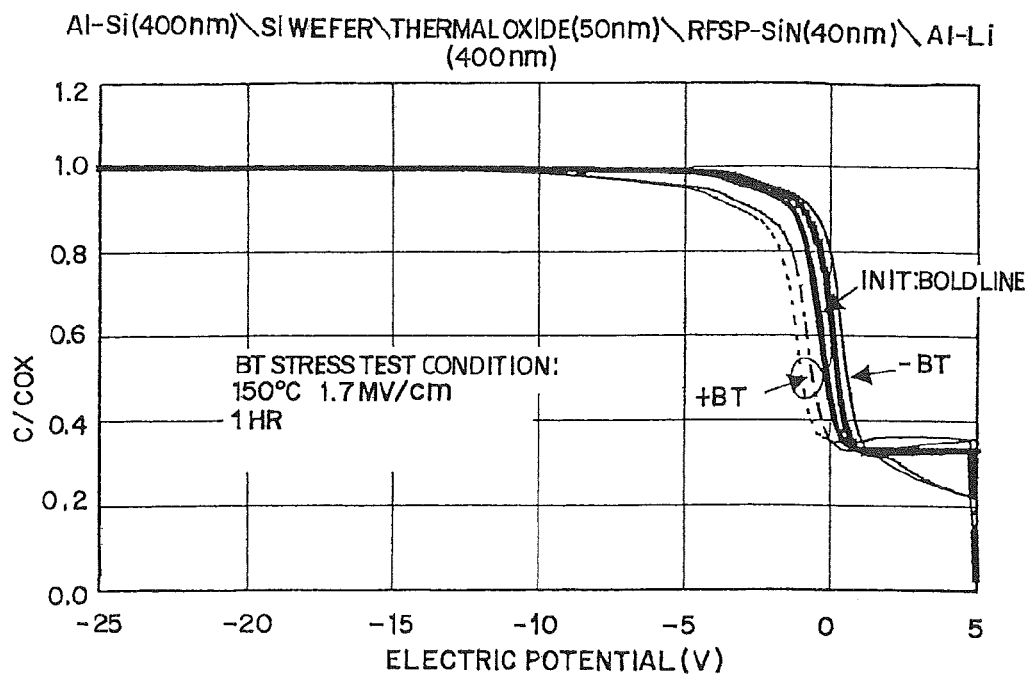
Figure 15A:
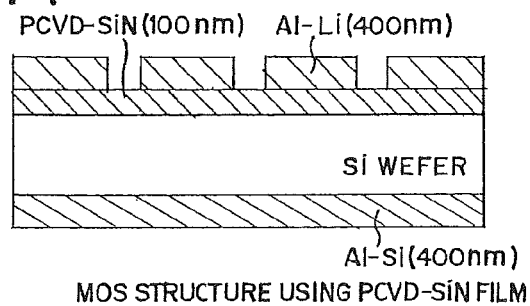
FIGS. 15A and 15B are diagrams for explaining a MOS structure.
Figure 15B:
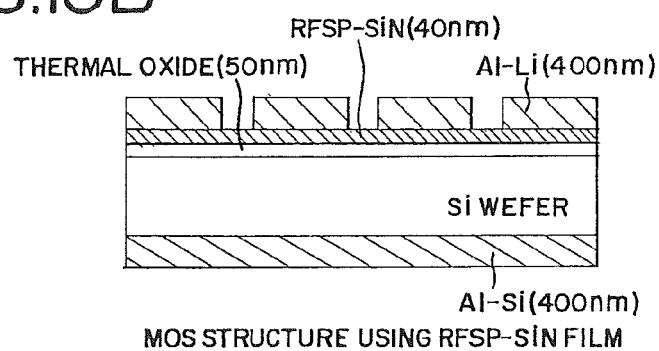

Next, FIGS. 14A and 14B are C-V characteristics before and after BT stress tests of MOS structures in which silicon nitride films formed under the film formation conditions of FIG. 20 are used as dielectrics. The difference between FIG. 14A and FIG. 14B is that while an Al—Si (aluminum film to which silicon is added) is used as a surface electrode in FIG. 14A, an Al—Li (aluminum film to which lithium is added) is used as a surface electrode in FIG. 14B. Note that the results of FIG. 14B are the results of measurements of the MOS structure shown in FIG. 15B. A thermal oxidation film and a laminate structure is used here in order to reduce the influence of interface levels between the silicon nitride film and the silicon substrate.

Comparing the graphs of FIG. 14A and FIG. 14B, there is almost no difference in the shift of the C-V characteristics in both graphs before and after the BT stress tests, and influence caused by lithium diffusion does not appear. That is, it can be confirmed that the silicon nitride film formed under the film formation conditions of FIG. 20 functions effectively as a blocking film.

The inorganic insulating films used in the present invention are extremely dense and have a good blocking effect against the mobile elements Na and Li. The diffusion of outgassing components from the leveling film is therefore suppressed, and the diffusion of Li from the Al—Li electrode and the like is effectively suppressed, and a display device having high reliability can thus be achieved. The applicants of the present invention conjecture that the reason for the dense film formation is that a thin silicon nitride film formed on the surface of the single crystal silicon target, and that silicon nitride film is laminated onto the substrate during film formation, and therefore silicon clusters are difficult to mix into the film. As a result, the film becomes dense.

Further, the film is formed by low temperature sputtering on the order of the room temperature to 200° C. This is more effective than plasma CVD in that film formation can be performed on resin films, as when using the film as a barrier film of the present invention.

Note that the aforementioned silicon nitride film can also be used as a passivation film covering the organic light emitting element, and a portion of the silicon nitride film can be used for cases in which the gate insulating film is formed by a laminate film.

In addition, a successive film formation process can be employed in the method of manufacturing a light emitting device having a structure like that shown by FIG. 6 by forming the third insulating film 620 and the anode 621, manufactured by using a transparent conductive film, typically ITO, by sputtering. Sputtering is suitable in forming a dense silicon nitride film or silicon oxynitride film without imparting conspicuous damage to the surface of the organic insulating film 619.

A light emitting device can thus be completed by forming a pixel portion in which TFTs and a light emitting device are combined. This type of light emitting device can form the driver circuits on the same substrate using TFTs. By surrounding the semiconductor film, the gate insulating film, and the gate electrodes, which are the main structural elements of the TFTs, on their lower layer and upper layer sides by using blocking layers and protective films made from silicon nitride or silicon oxynitride, a structure will result in which contamination due to alkaline metals and organics can be prevented. On the other hand, the organic light emitting element contains alkaline metals. A structure in which the penetration of oxygen and moisture from the outside is prevented can be obtained by surrounding the organic light emitting element with a protective film made from silicon nitride, silicon oxynitride, or a DLC film, and a gas partitioning layer made from an insulating film having silicon nitride or carbon as its main constituent.

A technique of completing a light emitting device in which elements having different characteristics with respect to impurities are combined, without mutual interference, is thus provided.

A top gate TFT structure is explained by FIG. 6, but it is also possible, of course, to apply bottom gate TFTs and reverse stagger TFTs. Reverse stagger TFTs are applied to a pixel portion 751 in FIG. 7, and a switching TFT 754 and an electric current control TFT 755 are formed. Gate electrodes 702 and 703, and a wiring 704 are formed on a substrate 701 by using molybdenum, tantalum, or the like, and a first insulating film 705 that functions as a gate insulating film is formed thereon. Silicon oxide, silicon nitride, or the like at a thickness of 100 to 200 nm is used in forming the first insulating film.

In addition to channel forming regions, source or drain regions and LDD regions are formed in semiconductor films 706 and 707. These regions are formed, and insulating films 708 and 709 are formed in order to protect the channel forming regions. A second insulating film 710 is formed by silicon nitride or silicon oxynitride, and is formed so that the semiconductor film is not contaminated by alkaline metals, organics, and the like. In addition, a leveling film 711 made from an organic resin material such as polyimide is formed. A third insulating film 712 made from silicon nitride or silicon oxide is formed on the leveling film 711. Wirings 713 to 716 are formed on the third insulating film 712.

An anode 717 of an organic light emitting element 756 is formed on the third insulating film 712, and a partitioning layer 718 is formed afterward by using an inorganic insulating material selected from the group consisting of silicon nitride, silicon oxynitride, aluminum oxynitride, aluminum oxide, and aluminum nitride. Further, the partitioning layer 718 is formed covering upper surfaces and side surfaces of photoresist 723 which remains on the wirings 713 to 716. In addition, the partitioning layer 718 is formed so as to cover edge portions of the anode 717 and the TFT wirings, and prevents short circuits between a cathode and the anode in these portions. Structures for an organic compound layer 720, a cathode 721, and a fourth insulating film are formed similarly to those of FIG. 6, and a fourth insulating film 722 is formed similarly to the third insulating film 712. A light emitting device having reverse stagger TFTs can thus be completed.

Figure 7:
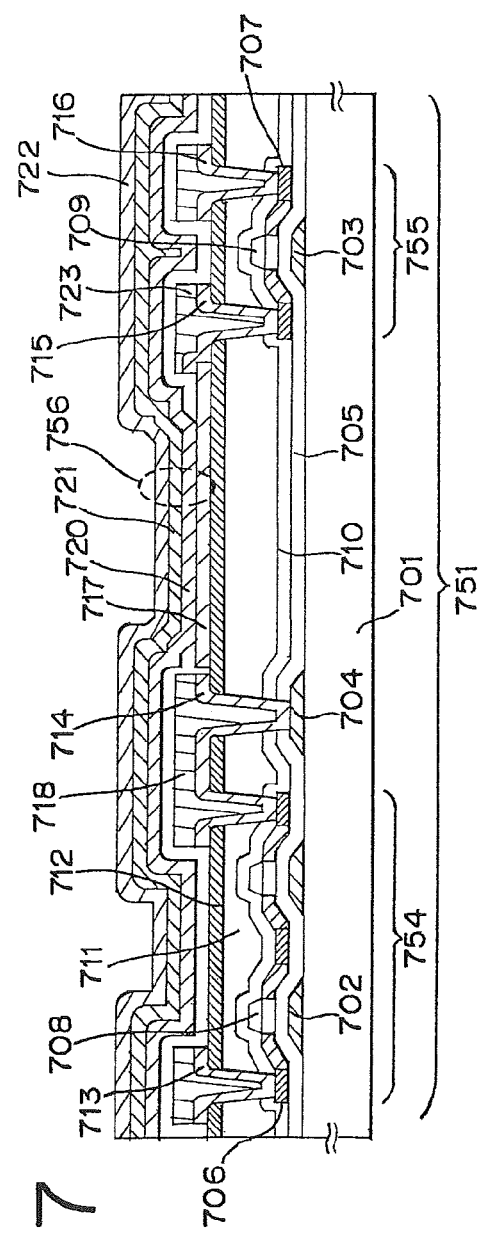
FIG. 7 is a partial cross sectional diagram for explaining the structure of a pixel portion of a light emitting device.

Although only the pixel portion is shown in FIG. 7, driver circuits can also be formed on the same substrate by using reverse stagger TFTs. The semiconductor film, which is the main structural element of the TFTs, is surrounded on its lower layer side and its upper layer side by the first insulating film and the second insulating film made from silicon nitride or silicon oxynitride as shown in FIG. 7, and this is a structure in which contamination by alkaline metals and organics is prevented. On the other hand, the organic light emitting element contains alkaline metals, and a structure in which the penetration of oxygen and moisture from the outside is prevented is obtained from using the third insulating film, the fourth insulating film, and the partitioning layer 718. A technique of completing a light emitting device in which elements having different characteristics with respect to impurities are combined, without mutual interference, can thus be provided by using reverse stagger TFTs.

A structure in which an organic light emitting element is sealed is shown in FIG. 8. A state is shown in FIG. 8 in which an element substrate 401 on which a driver circuit 408 and a pixel portion 409 are formed using TFTs, and a sealing substrate 402 are fixed by a sealing material 405. A protective film 406 is formed by a material selected from the group consisting of silicon nitride films, silicon oxynitride films, DLC films, carbon nitride films, aluminum oxide films, aluminum nitride films, and aluminum oxynitride films. Further, a silicon nitride film may also be used as a buffer layer below the protective film 406. An organic light emitting element 403 is formed within a sealed region between the element substrate 401 and the sealing substrate 402, and a drying agent may also be placed on the driver circuit 408 or in the vicinity of where the sealing material 405 is formed.

An organic resin material such as polyimide, polyethylene terephthalate (PET), polyethylene naphthalene (PEN) polyether sulfone (PES) and aramid is used for the sealing substrate. A thickness on the order of 30 to 120 μm is employed for the sealing substrate, providing flexibility. A DLC film is formed as a gas partitioning layer 407 in an edge portion. Note that the DLC film is not formed on an external input terminal 404. An epoxy adhesive is used as the sealing material. By forming the gas partitioning layer 407 along the sealing material 405, and along edge portions of the element substrate 401 and the sealing substrate 402, the permeation of water vapor can be prevented. The gas partitioning layer 407 is not limited to a DLC film, and can also be formed by materials similar to those used for the protective film 406.

FIG. 9 is a diagram showing an external view of this type of display device. Although the direction to which an image is displayed differs in accordance with the organic light emitting element structure, in this case light is emitted in an upward direction, to perform image display. The element substrate 401, on which the driver circuit portion 408 and the pixel portion 409 are formed by using TFTs, and the sealing substrate 402 are bonded by using the sealing material 405 in the structure shown by FIG. 9. Further, in addition to the driver circuit portion 408, a signal processing circuit 606 for correcting a video signal and for storing the video signal may also be formed. The input terminal 404 is formed in an edge of the element substrate 401, and an FPC (flexible printed circuit) is connected to this portion. Terminals for inputting an image data signal, various types of timing signals, and electric power from external circuits are formed in the input terminal 404 at a pitch of 500 μm. A connection with the driver circuit portion is made by a wiring 410. Further, an IC chip 411 in which a CPU, memory, and the like are formed may also be mounted on the element substrate 401 by using COG (chip on glass) or the like when necessary.

The DLC film is formed in edge portions adjacent to the sealing material, and water vapor, oxygen, and the like from the sealing portion are prevented from penetrating, thus preventing degradation of the organic light emitting element. The input terminal portion may be omitted and instead, a DLC film may be formed over the entire surface for cases in which an organic resin material is used for the element substrate 401 and the sealing substrate 402. The input terminal portion may be covered in advance by using masking tape of a shadow mask when forming the DLC film.

The organic light emitting element can thus be sealed, and a light emitting device can be formed. This becomes a structure in which the TFTs and the organic light emitting elements are surrounded by insulating films, and impurities from the outside do not penetrate. In addition, the element substrate is bonded using a sealing material, and the air-tightness is increased by covering edge portions using DLC. Degradation of the light emitting device can thus be prevented.

As explained above, the concentration of oxygen as an impurity element in layers made from organic compounds that function as hole injecting layers, hole transporting layers, light emitting layers, and the like in organic light emitting elements can be reduced to a level equal to or less than $5 \times 10^{19}/cm^3$, preferably equal to or less than $1 \times 10^{19}/cm^3$, by using the present invention. Further, semiconductor films, gate insulating films, and gate electrodes, which are the main structural elements of TFTs, are surrounded by inorganic insulating materials selected from the group consisting of silicon nitride, silicon oxynitride, aluminum oxynitride, aluminum oxide, and aluminum nitride with the present invention, thus providing a structure in which contamination by alkaline metals and organics is prevented. On the other hand, organic light emitting elements contain alkaline metals, and a structure in which penetration of oxygen and moisture from the outside is prevented by surrounding the organic light emitting elements using an inorganic insulating material selected from the group consisting of silicon nitride, silicon oxynitride, aluminum oxynitride, aluminum oxide, aluminum nitride, DLC, and carbon nitride is achieved. In accordance with this type of structure, a light emitting device in which elements having different characteristics with respect to impurities are combined, without mutual interference, can thus be completed.

What is claimed is:

1. A light emitting device comprising:
   a substrate;
   a transistor over the substrate; and
   a light emitting element comprising a light emitting layer over the substrate, the light emitting element being electrically connected to the transistor,
   wherein the light emitting layer comprises oxygen at a concentration equal to or less than $1 \times 10^{19}/cm^3$, and
   wherein the light emitting layer comprises an organic compound.

2. The light emitting device according to claim 1, wherein the substrate is an organic resin substrate.

3. The light emitting device according to claim 2, wherein the organic resin substrate comprises any one of polyimide, polyethylene terephthalate, polyethylene naphthalene, polyether sulfone, and aramid.

4. The light emitting device according to claim 1, wherein the light emitting element further comprises:
   an anode between the substrate and the light emitting layer; and
   a cathode over the light emitting layer.

5. The light emitting device according to claim 1, wherein the organic compound is capable of obtaining light emission from a triplet excitation state.

6. A light emitting device comprising:
   a substrate;
   a transistor over the substrate; and
   a light emitting element comprising a hole transporting layer over the substrate, the light emitting element being electrically connected to the transistor,
   wherein the hole transporting layer comprises oxygen at a concentration equal to or less than $1 \times 10^{19}/cm^3$, and
   wherein the hole transporting layer comprises an aromatic amine-based material.

7. The light emitting device according to claim 6, wherein the substrate is an organic resin substrate.

8. The light emitting device according to claim 7, wherein the organic resin substrate comprises any one of polyimide, polyethylene terephthalate, polyethylene naphthalene, polyether sulfone, and aramid.

9. The light emitting device according to claim 6, wherein the light emitting element further comprises:
   an anode between the substrate and the hole transporting layer; and
   a cathode over the hole transporting layer.

10. A light emitting device comprising:
    a transistor;
    an insulating film over the transistor; and
    a light emitting element comprising a light emitting layer and an electron transporting layer over the insulating film, the light emitting element being electrically connected to the transistor,
    wherein the light emitting layer comprises oxygen at a concentration equal to or less than $1 \times 10^{19}/cm^3$,
    wherein the light emitting layer comprises an organic compound, and
    wherein the concentration of oxygen in the light emitting layer is lower than a concentration of oxygen in the electron transporting layer.

11. The light emitting device according to claim 10, wherein the insulating film is made from silicon oxide or silicon nitride.

12. The light emitting device according to claim 10, wherein the light emitting element further comprises:
    an anode between the insulating film and the light emitting layer; and
    a cathode over the light emitting layer.

13. The light emitting device according to claim 10, wherein the organic compound is capable of obtaining light emission from a triplet excitation state.

14. A light emitting device comprising:
    a substrate;
    a transistor over the substrate; and
    a light emitting element comprising a light emitting layer over the substrate, the light emitting element being electrically connected to the transistor,
    wherein a second ion intensity of oxygen in a region of the light emitting layer measured by secondary ion mass spectroscopy is lower than $1.0 \times 10^3$ (counts/sec).

15. The light emitting device according to claim 14, wherein the substrate is an organic resin substrate.

16. The light emitting device according to claim 15, wherein the organic resin substrate comprises any one of polyimide, polyethylene terephthalate, polyethylene naphthalene, polyether sulfone, and aramid.

17. The light emitting device according to claim 14, wherein the light emitting element further comprises:
- an anode between the substrate and the light emitting layer; and
- a cathode over the light emitting layer.

18. A light emitting device comprising:
- a substrate;
- a transistor over the substrate;
- an anode electrically connected to the transistor;
- a light emitting layer over the anode; and
- a cathode over the light emitting layer,
- wherein a second ion intensity of oxygen in a region of the light emitting layer measured by secondary ion mass spectroscopy is lower than $1.0 \times 10^3$ (counts/sec) when a second ion intensity of oxygen in a region of the anode measured by the secondary ion mass spectroscopy is higher than $1.0 \times 10^6$ (counts/sec).

19. The light emitting device according to claim 18, wherein the substrate is an organic resin substrate.

20. The light emitting device according to claim 19, wherein the organic resin substrate comprises any one of polyimide, polyethylene terephthalate, polyethylene naphthalene, polyether sulfone, and aramid.

* * * * *